(12) United States Patent
Jung et al.

(10) Patent No.: US 12,087,766 B2
(45) Date of Patent: Sep. 10, 2024

(54) INTEGRATED CIRCUIT DEVICE

(71) Applicant: SAMSUNG ELECTRONICS CO., LTD., Suwon-si (KR)

(72) Inventors: Sujin Jung, Hwaseong-si (KR); Kihwan Kim, Seoul (KR); Sunguk Jang, Hwaseong-si (KR); Youngdae Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 584 days.

(21) Appl. No.: 17/383,749

(22) Filed: Jul. 23, 2021

(65) Prior Publication Data
US 2022/0199618 A1 Jun. 23, 2022

(30) Foreign Application Priority Data
Dec. 23, 2020 (KR) .................. 10-2020-0182425

(51) Int. Cl.
- *H01L 27/088* (2006.01)
- *H01L 29/06* (2006.01)
- *H01L 29/78* (2006.01)

(52) U.S. Cl.
CPC ...... *H01L 27/0886* (2013.01); *H01L 29/0669* (2013.01); *H01L 29/7851* (2013.01)

(58) Field of Classification Search
CPC ............. H01L 27/0886; H01L 29/0669; H01L 29/7851; H01L 21/02381; H01L 21/02433; H01L 21/02532; H01L 21/02576; H01L 21/0262; H01L 29/045; H01L 29/0673; H01L 29/0847; H01L 29/42392; H01L 29/66439; H01L 29/775; H01L 29/78696; H01L 21/823431; H01L 29/0665; H01L 21/823425; H01L 21/02598;
(Continued)

(56) References Cited

U.S. PATENT DOCUMENTS 10,431,585 B2 10/2019 Yang et al.
10,679,906 B2 6/2020 Cheng et al.
(Continued)

OTHER PUBLICATIONS

Basic Crystallographic Definitions and Properties of Si, SiGe, and Ge Jun. 2002 Virginia Semiconductor, Inc. https://www.virginiasemi.com/pdf/BasicCrystallographicPropertiesofSi.pdf (Year: 2002).*

*Primary Examiner* — Andres Munoz
*Assistant Examiner* — William C. Trice, III
(74) *Attorney, Agent, or Firm* — Muir Patent Law, PLLC

(57) ABSTRACT

An integrated circuit (IC) device includes a fin-type active region extending longitudinally in a first lateral direction on a substrate. A nanosheet is apart from a fin top surface of the fin-type active region in a vertical direction. An inner insulating spacer is between the substrate and the nanosheet. A gate line includes a main gate portion and a sub-gate portion. The main gate portion extends longitudinally in a second lateral direction on the nanosheet. The sub-gate portion is integrally connected to the main gate portion and between the substrate and the nanosheet. A source/drain region is in contact with the inner insulating spacer and the nanosheet. The source/drain region includes a single crystalline semiconductor body and at least one lower stacking fault surface linearly extending from the inner insulating spacer through the single crystalline semiconductor body.

20 Claims, 21 Drawing Sheets

(58) Field of Classification Search
CPC ..... H01L 21/823412; H01L 21/823437; H01L 21/823462; H01L 21/823475; B82Y 10/00
See application file for complete search history.

(56) References Cited

U.S. PATENT DOCUMENTS

| | | |
|---|---|---|
| 2006/0079056 A1* | 4/2006 | Kim .................. H01L 21/0245 438/285 |
| 2009/0079008 A1 | 3/2009 | Nandakumar et al. |
| 2015/0041897 A1* | 2/2015 | Basker ................ H01L 29/165 438/157 |
| 2017/0141229 A1* | 5/2017 | Liou ................ H01L 21/02521 |
| 2019/0237360 A1* | 8/2019 | Reznicek .......... H01L 29/66439 |
| 2020/0098879 A1 | 3/2020 | Lee et al. |
| 2020/0098897 A1 | 3/2020 | Tapily et al. |
| 2020/0168742 A1 | 5/2020 | Wang et al. |
| 2020/0220018 A1 | 7/2020 | Jang et al. |

* cited by examiner

INTEGRATED CIRCUIT DEVICE

CROSS-REFERENCE TO RELATED APPLICATION

Korean Patent Application No. 10-2020-0182425, filed on Dec. 23, 2020, in the Korean Intellectual Property Office, and entitled: "Integrated Circuit Device," is incorporated by reference herein in its entirety.

BACKGROUND

1. Field

Embodiments relate to an integrated circuit (IC) device.

2. Description of the Related Art

As the downscaling of an integrated circuit device (IC device) has progressed, it has become important to ensure not only a high operating speed but also operation accuracy in the IC device.

SUMMARY

Embodiments are directed to an integrated circuit device, including: a fin-type active region extending longitudinally in a first lateral direction on a substrate; a nanosheet disposed at a position apart from a fin top surface of the fin-type active region in a vertical direction, and facing the fin top surface; an inner insulating spacer between the substrate and the nanosheet; a gate line including a main gate portion and a sub-gate portion, the main gate portion extending longitudinally in a second lateral direction on the nanosheet, the sub-gate portion being integrally connected to the main gate portion and between the substrate and the nanosheet, wherein the second lateral direction intersects with the first lateral direction; and a source/drain region facing the sub-gate portion with the inner insulating spacer therebetween in the first lateral direction, the source/drain region being in contact with the inner insulating spacer and the nanosheet, the source/drain region including a single crystalline semiconductor body and at least one lower stacking fault surface linearly extending from the inner insulating spacer through the single crystalline semiconductor body toward an inside of the source/drain region.

Embodiments are directed to an integrated circuit device, including: a fin-type active region extending longitudinally in a first lateral direction on a substrate; a source/drain region on the fin-type active region; first and second nanosheet stacks on a fin top surface of the fin-type active region, the first and second nanosheet stacks being apart from each other with the source/drain region therebetween in the first lateral direction, each of the first and second nanosheet stacks including a plurality of nanosheets overlapping each other in a vertical direction; a first gate line surrounding the first nanosheet stack on the fin-type active region, the first gate line extending longitudinally in a second lateral direction intersecting with the first lateral direction; a second gate line surrounding the second nanosheet stack on the fin-type active region, the second gate line extending longitudinally in the second lateral direction; a first insulating spacer between the first gate line and the source/drain region; and a second insulating spacer between the second gate line and the source/drain region. The source/drain region may include a single crystalline semiconductor body and a plurality of stacking fault surfaces linearly extending from the first insulating spacer and the second insulating spacer through the single crystalline semiconductor body toward an inside of the source/drain region.

Embodiments are directed to an integrated circuit device, including: a fin-type active region extending longitudinally in a first lateral direction on a substrate; a nanosheet stack on a fin top surface of the fin-type active region, the nanosheet stack including a plurality of nanosheets overlapping each other in a vertical direction; a gate line including a main gate portion and a plurality of sub-gate portions, the main gate portion extending longitudinally in a second lateral direction on the substrate and the nanosheet stack, the second lateral direction intersecting with the first lateral direction, the plurality of sub-gate portions being between two adjacent ones of the plurality of nanosheets, and the plurality of sub-gate portions being integrally connected to the main gate portion; a plurality of inner insulating spacers respectively between the plurality of nanosheets, the plurality of inner insulating spacers covering respective sidewalls of the plurality of sub-gate portions; and a pair of source/drain regions on opposite sides of the gate line on the fin-type active region, the pair of source/drain regions being in contact with at least one inner insulating spacer adjacent thereto, from among the plurality of inner insulating spacers. Each of the pair of source/drain regions may include a single crystalline semiconductor body and a plurality of stacking fault surfaces linearly extending from the at least one inner insulating spacer adjacent thereto through the single crystalline semiconductor body toward insides of the source/drain regions, the plurality of stacking fault surfaces having an angle of about 50° to about 60° with respect to a straight line in the first lateral direction.

BRIEF DESCRIPTION OF THE DRAWINGS

Features will become apparent to those of skill in the art by describing in detail example embodiments with reference to the attached drawings in which.

DETAILED DESCRIPTION

Figure 1:
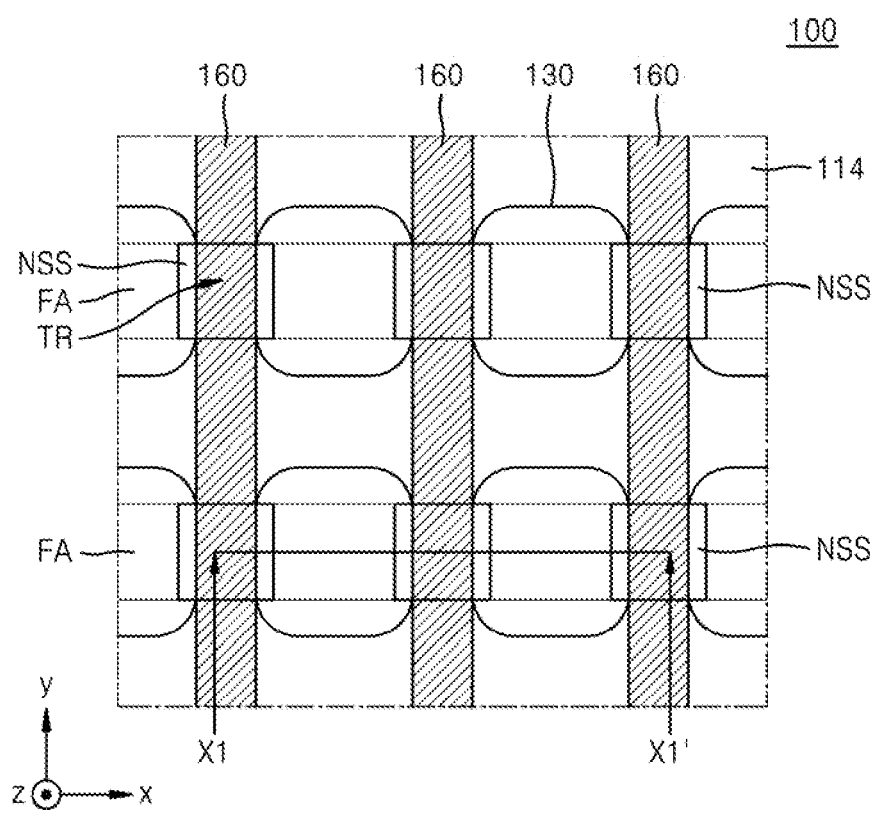
FIG. 1 is a plan layout diagram of some components of an integrated circuit (IC) device 500 according to an example embodiment.
Figure 2A:
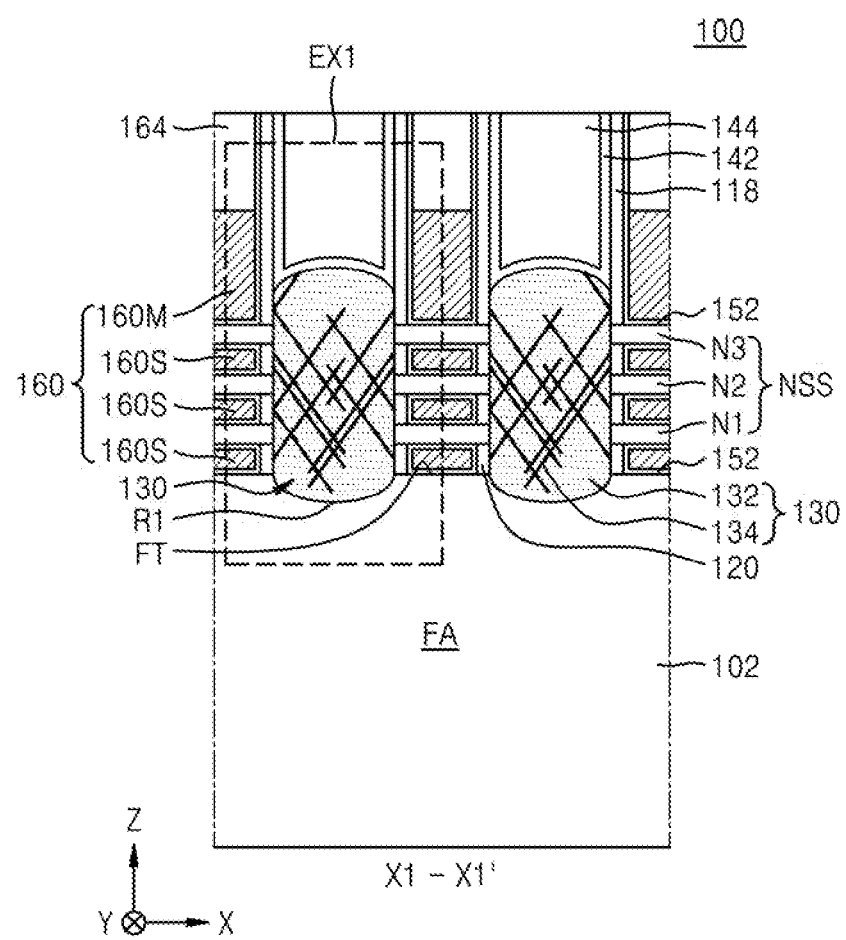
FIG. 2A is a cross-sectional view taken along line X1-X1' of FIG. 1.
Figure 2B:
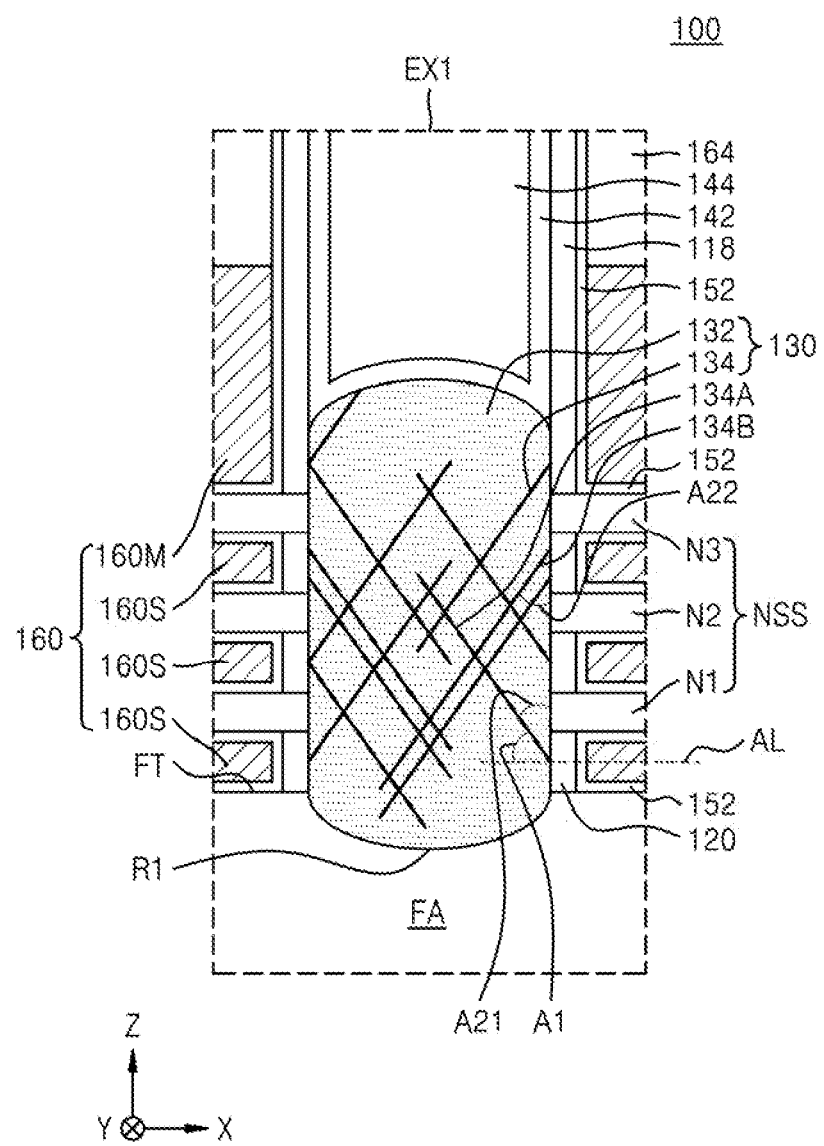
FIG. 2B is an enlarged cross-sectional view of partial region "EX1" of FIG. 2A.

FIG. 1 is a plan layout diagram of some components of an integrated circuit (IC) device 100 according to an example embodiment. FIG. 2A is a cross-sectional view taken along line X1-X1' of FIG. 1. FIG. 2B is an enlarged cross-sectional view of partial region "EX1" of FIG. 2A.

Referring to FIGS. 1, 2A, and 2B, the IC device 100 may include a plurality of fin-type active regions FA that protrude from a substrate 102 in a vertical direction (Z direction) and extend long or longitudinally in a first lateral direction (X direction).

The IC device 100 may include a plurality of nanosheet stacks NSS on the plurality of fin-type active regions FA. As used herein, the term "nanosheet" refers to a conductive structure having a cross-section that is substantially perpendicular to a direction in which current flows. The nanosheet may be interpreted as including a nanowire.

The substrate 102 may include a semiconductor, such as silicon (Si) or germanium (Ge), or a compound semiconductor, such as silicon germanium (SiGe), silicon carbide (SiC), gallium arsenide (GaAs), indium arsenide (InAs), indium gallium arsenide (InGaAs), or indium phosphide (InP). As used herein, each of the terms "SiGe," "SiC," "GaAs," "InAs," "InGaAs," and "InP" refers to a material including elements included therein, without referring to a chemical formula representing a stoichiometric relationship. In an example embodiment, a main surface of the substrate 102 may have a {100} surface orientation.

The IC device 100 may include a device isolation film 114 on the substrate 102 and disposed to cover both sidewalls of each of the plurality of fin-type active regions FA. The device isolation film 114 may include an oxide film, a nitride film, or a combination thereof.

The IC device 100 may include a plurality of gate lines 160 disposed to extend long in a second lateral direction (Y direction) on the plurality of fin-type active regions FA. The second lateral direction (Y direction) may intersect with the first lateral direction (X direction).

The plurality of nanosheets stacks NSS may be respectively on fin top surfaces FT of the plurality of fin-type active regions FA at intersections between the plurality of fin-type active regions FA and the plurality of gate lines 160. Each of the plurality of nanosheet stacks NSS may face the fin top surface FT at a position apart from the fin-type active region FA. Each of the plurality of nanosheet stacks NSS may include a plurality of nanosheets (e.g., first, second, and third nanosheets N1, N2, and N3), which overlap each other in the vertical direction (Z direction) on the fin top surface FT of the fin-type active region FA. The first to third nanosheets N1, N2, and N3 may be located at different vertical distances (or Z-directional distances) from the fin top surface FT of the fin-type active region FA. The first to third nanosheets N1, N2, and N3 may be sequentially stacked on the fin top surface FT of the fin-type active region FA.

FIG. 1 illustrates an example in which a planar shape of the nanosheet stack NSS is substantially a tetragonal shape, but the nanosheet stack NSS may have various planar shapes according to a planar shape of each of the fin-type active region FA and the gate line 160. The present example embodiment illustrates a configuration in which the plurality of nanosheet stacks NSS and the plurality of gate lines 160 are formed on one fin-type active region FA and the plurality of nanosheet stacks NSS are arranged in a line in the first lateral direction (X direction) on one fin-type active region FA, but the numbers of nanosheet stacks NSS and gate lines 160 on one fin-type active region FA may be varied from that illustrated.

Each of the first to third nanosheets N1, N2, and N3 may have a channel region. Each of the first to third nanosheets N1, N2, and N3 may have a thickness selected in a range of, e.g., about 4 nm to about 6 nm. Here, the thickness of each of the first to third nanosheets N1, N2, and N3 refers to a size of each of the first to third nanosheets N1, N2, and N3 in the vertical direction (Z direction). In an example embodiment, the first to third nanosheets N1, N2, and N3 may have substantially the same thickness in the vertical direction (Z direction). In another example embodiment, at least some of the first to third nanosheets N1, N2, and N3 may have different thicknesses in the vertical direction (Z direction).

In an example embodiment, at least some of the first to third nanosheets N1, N2, and N3 may have substantially the same size or similar sizes in the first lateral direction (X direction). In another example embodiment, at least some of the first to third nanosheets N1, N2, and N3 included in one nanosheet stack NSS may have different sizes in the first lateral direction (X direction). For example, in the first lateral direction (X direction), a length of each of the first nanosheet N1 and the second nanosheet N2 that are relatively close to the fin top surface FT, from among the first to third nanosheets N1, N2, and N3, may be less than a length of the third nanosheet N3 that is farthest from the fin top surface FT. In this case, an effective channel length of a channel formed in each of the first nanosheet N1 and the second nanosheet N2 that are relatively close to the fin top surface FT may be less than an effective channel length of a channel formed in the third nanosheet N3. Thus, the amounts of current flowing through the first nanosheet N1 and the second nanosheet N2 may be increased at the same operating voltage.

The IC device 100 may include a plurality of recesses R1 formed in the fin-type active region FA. FIGS. 2A and 2B illustrate a case in which a lowest surface of each of the plurality of recesses R1 is at a lower level than the fin top surface FT of the fin-type active region FA, but the lowermost level of each of the plurality of recesses R1 may be at substantially the same level as or a similar level to the fin top surface FT of the fin-type active region FA. In an example embodiment, a vertical distance between a level of the lowermost surface of each of the plurality of recesses R1 and a level of the fin top surface FT of the fin-type active region FA may be in a range of, e.g., about 0 nm to about 20 nm. As used herein, a term "level" refers to a distance from a bottom surface of the substrate 102 in the vertical direction (Z direction or −Z direction).

The IC device 100 may include a plurality of source/drain regions 130 on the plurality of recesses R1. Each of the plurality of source/drain regions 130 may be in contact with the first to third nanosheets N1, N2, and N3 of the nanosheet stack NSS adjacent thereto.

In an example embodiment, each of the plurality of source/drain regions 130 may include a silicon layer doped with an n-type dopant. The n-type dopant may include, e.g., phosphorus (P), arsenic (As), or antimony (Sb).

In an example embodiment, the plurality of source/drain regions 130 may include an epitaxially grown semiconductor layer. Each of the plurality of source/drain regions 130 may include a vertical overgrowth portion at a higher level than an uppermost surface of the nanosheet stack NSS in the vertical direction (Z direction).

Each of the plurality of source/drain regions 130 may include a single crystalline semiconductor body 132 and a plurality of stacking fault surfaces 134, each of which passes through a portion of the single crystalline semiconductor body 132 and linearly extends in the source/drain region 130. In an example embodiment, the single crystalline semiconductor body 132 may include single crystalline silicon doped with n-type impurities. In the single crystalline semiconductor body 132, silicon crystal arrangements may be regularly and continuously provided. Each of the plurality of stacking fault surfaces 134 may include a discontinuous surface in which silicon crystal arrangements are not regularly connected.

Figure 2C:
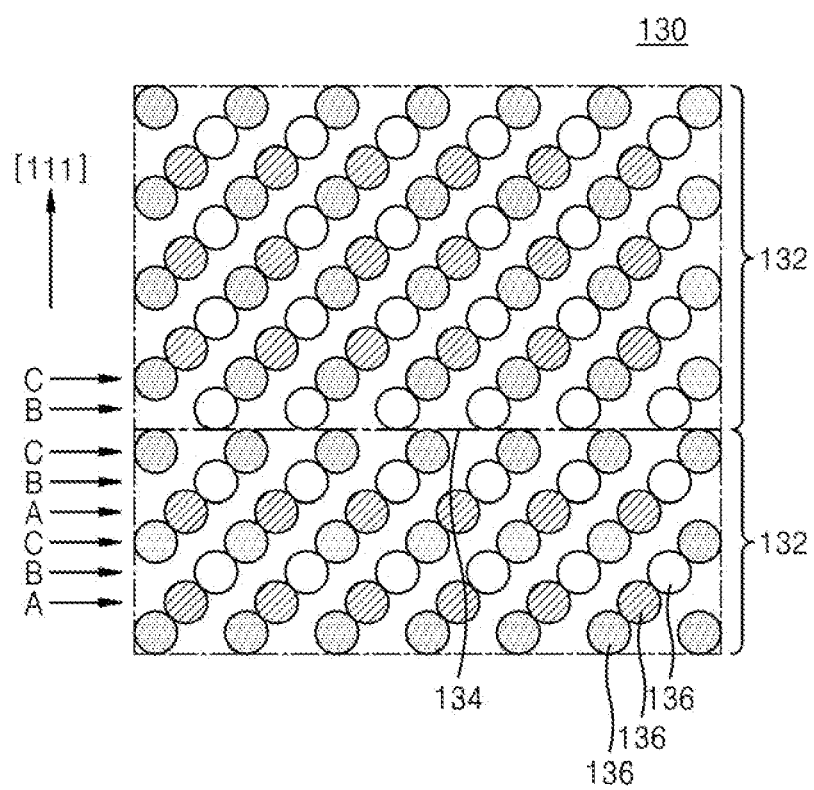
FIG. 2C is an enlarged view for explaining a crystal structure of a source/drain region included in an IC device according to an example embodiment.

FIG. 2C is a schematic enlarged view of a partial region of the source/drain region 130 to explain crystal structures of the plurality of source/drain regions 130.

Referring to FIG. 2C, in the single crystalline semiconductor body 132 of the source/drain region 130, a plurality of silicon atoms 136 may be stacked in a regularly repeated order of ABCABC . . . in a direction [111] to form a face centered cubic structure. The single crystalline semiconductor body 132, in which the plurality of silicon atoms 136 are stacked in the regularly repeated order of ABCABC . . . in the direction [111], may lose regularity at the stacking fault surface 134. That is, the stacking fault surface 134 may include a portion in which the regularity of the single crystalline semiconductor body 132 does not continue but breaks. For example, referring to FIG. 2C, in silicon crystal structures of the stacking fault surface 134 and vicinities thereof, the silicon atoms 136 may be stacked in an order of ABCBC . . . , in which A is omitted (instead of the order of ABCABC . . . ) in the direction [111].

Referring to FIGS. 1, 2A, and 2B, each of the plurality of stacking fault surfaces 134 included in the source/drain region 130 may linearly extend from an outer surface of the source/drain region 130 through the single crystalline semiconductor body 132 into the inside of the source/drain region 130.

In an example embodiment, in the source/drain region 130, at least one of the plurality of stacking fault surfaces 134 may extend in a direction parallel to a crystal plane {111} of the single crystalline semiconductor body 132.

Referring to FIG. 2B, in an example embodiment, a first angle (e.g., A1) between a direction of each of the plurality of stacking fault surfaces 134 and a {100} surface orientation of the substrate 102 may be in a range of about 45° to about 65°. For example, the first angle A1 between each of the plurality of stacking fault surfaces 134 and a straight line in the first lateral direction (X direction), e.g., a straight line AL of FIG. 2B, may be in a range of about 50° to about 60°. In an example embodiment, an angle between an extension line of each of the plurality of stacking fault surfaces 134 and an extension line of the fin top surface FT of the fin-type active region FA may be in a range of about 45° to about 65°, e.g., about 50° to about 60°. In an example embodiment, the first angle A1 between at least one of the plurality of stacking fault surfaces 134 and the straight line in the first lateral direction (X direction), e.g., the straight line AL of FIG. 2B, may be about 54.7°.

In an example embodiment, second angles (e.g., A21 and A22) between the direction of each of the plurality of stacking fault surfaces 134 and a {110} orientation of the substrate 102 may be in a range of about 45° to about 65°, and may be less than the first angle A1. For example, each of the second angles A21 and A22 between the plurality of stacking fault surfaces 134 and the vertical direction (Z direction) may be in a range of about 30° to about 40°. Each of the second angles A21 and A22 may be less than the first angle A1. In an example embodiment, each of the second angles A21 and A22 between at least one of the plurality of stacking fault surfaces 134 and a straight line in the vertical direction (Z direction) may be about 35.3°.

Referring again to FIGS. 1 and 2A, the plurality of gate lines 160 may extend long in the second lateral direction (Y direction) on the fin-type active region FA and the device isolation film 114. Each of the plurality of gate lines 160 may cover the nanosheet stack NSS and surround each of the first to third nanosheets N1, N2, and N3 on the fin-type active region FA.

Each of the plurality of gate lines 160 may include a main gate portion 160M and a plurality of sub-gate portions 160S. The main gate portion 160M may cover a top surface of the nanosheet stack NSS and extend in the second lateral direction (Y direction). The plurality of sub-gate portions 160S may be integrally connected to the main gate portion 160M and arranged one by one between the first to third nanosheets N1, N2, and N3 and between the fin-type active region FA and the first nanosheet N1. In the vertical direction (Z direction), a thickness of each of the plurality of sub-gate portions 160S may be less than a thickness of the main gate portion 160M. The first to third nanosheets N1, N2, and N3 may be surrounded by the gate line 160.

The gate lines 160 may include a metal, a metal nitride, a metal carbide, or a combination thereof. The metal may include, e.g., titanium (Ti), tungsten (W), ruthenium (Ru), niobium (Nb), molybdenum (Mo), hafnium (Hf), nickel (Ni), cobalt (Co), platinum (Pt), yttrium (Yb), terbium (Tb), dysprosium (Dy), erbium (Er), or palladium (Pd). The metal nitride may include, e.g., titanium nitride (TiN) or tantalum nitride (TaN). The metal carbide may include titanium aluminum carbide (TiAlC).

Each of the plurality of source/drain regions 130 may be on the fin-type active region FA at a position adjacent to the gate line 160 in the first lateral direction (X direction). Each of the plurality of source/drain regions 130 may face the nanosheet stack NSS and the plurality of sub-gate portion 160S in the first lateral direction (X direction).

The IC device 100 may include a gate dielectric film 152 between the nanosheet stack NSS and the gate line 160. In an example embodiment, the gate dielectric film 152 may have a stack structure of an interface film and a high-k dielectric film. The interface film may include a high-k dielectric material film having a dielectric constant of about 9 or less, e.g., a silicon oxide film, a silicon oxynitride film, or a combination thereof. In an example embodiment, the interface film may be omitted. The high-k dielectric film may include a material having a higher dielectric constant than a silicon oxide film. For example, the high-k dielectric film may have a dielectric constant of about 10 to about 25. The high-k dielectric film may include, e.g., hafnium oxide.

The IC device 100 may include a plurality of transistors TR formed at intersections between the plurality of fin-type active regions FA and the plurality of gate lines 160 on the substrate 102.

In an example embodiment, the first to third nanosheets N1, N2, and N3 may include semiconductor layers including the same element. In an example embodiment, each of the first to third nanosheets N1, N2, and N3 may include a silicon layer. The first to third nanosheets N1, N2, and N3 may be doped with a dopant of the same conductivity type as a conductivity type of the source/drain region 130. In an example embodiment, the first to third nanosheets N1, N2, and N3 may include a silicon layer doped with an n-type dopant. The n-type dopant may include, e.g., P, As, or Sb.

Each of the plurality of source/drain regions 130 may apply strain to the first to third nanosheets N1, N2, and N3. For example, the plurality of stacking fault surfaces 134 included in each of the plurality of source/drain regions 130 may cause the deformation (e.g., shrinkage deformation) of the source/drain regions 130. As a result, tensile stress may be applied by the plurality of source/drain regions 130 to the first to third nanosheets N1, N2, and N3, and thus, a lattice spacing between silicon atoms may increase in each of the first to third nanosheets N1, N2, and N3. When the transistor TR formed at the intersection between the fin-type active region FA and the gate line 160 is an NMOS transistor, the mobility of carriers in a channel region provided in the first to third nanosheets N1, N2, and N3 may be increased due to the increased lattice spacing between silicon atoms in each of the first to third nanosheets N1, N2, and N3 from the tensile stress. As a result, the performance of the transistor TR may be improved.

In an example embodiment, each of the first to third nanosheets N1, N2, and N3 and the substrate 102 may include a silicon film, and a first distance between two adjacent silicon atoms in silicon lattices included in at least partial regions of the first to third nanosheets N1, N2, and N3 may be greater than a second distance between two adjacent silicon atoms in silicon lattices included in at least a partial region of the substrate 102. For example, a first lattice constant of the silicon lattices included in the at least partial regions of the first to third nanosheets N1, N2, and N3 may be higher than a second lattice constant of the silicon lattices included in at least the partial region of the substrate 102. In an example embodiment, the first lattice constant may be selected in a range greater than about 5.43 Å and equal to or less than about 5.65 Å, and the second lattice constant may be about 5.43 Å. In another example embodiment, the first lattice constant may be selected in a range greater than about 5.43 Å and equal to or less than about 5.54 Å, and the second lattice constant may be about 5.43 Å.

Referring to FIGS. 2A and 2B, a top surface of each of the gate line 160 and the gate dielectric film 152 may be covered by a capping insulating pattern 164. The capping insulating pattern 164 may include a silicon nitride film. On the fin-type active region FA and the device isolation film 114 (see FIG. 1), both sidewalls of each of the gate line 160 and the capping insulating pattern 164 may be covered by a plurality of outer insulating spacers 118. The plurality of outer insulating spacers 118 may cover both sidewalls of the main gate portion 160M and the capping insulating pattern 164 on top surfaces of the plurality of nanosheet stacks NSS. Each of the plurality of outer insulating spacers 118 may be apart from the gate line 160 with the gate dielectric film 152 therebetween. Each of the plurality of source/drain regions 130 may be in contact with one of the outer insulating spacers 118, which is adjacent thereto.

The plurality of outer insulating spacers 118 may include silicon nitride (SiN), silicon carbonitride (SiCN), silicon boron nitride (SiBN), silicon oxynitride (SiON), silicon oxycarbonitride (SiOCN), silicon boron carbonitride (SiBCN), silicon oxycarbide (SiOC), silicon oxide (SiO), or a combination thereof. As used herein, each of the terms "SiN," "SiCN," "SiBN," "SiON," "SiOCN," "SiBCN," "SiOC," and "SiO" refers to a material including elements included therein, without referring to a chemical formula representing a stoichiometric relationship.

Referring to FIGS. 2A and 2B, a plurality of inner insulating spacers 120 may be between the first to third nanosheets N1, N2, and N3 and between the fin-type active region FA and the first nanosheet N1. Both sidewalls of each of the plurality of sub-gate portions 160S may be covered by the inner insulating spacers 120 with the gate dielectric film 152 therebetween. Each of the plurality of sub-gate portions 160S may be apart from the source/drain region 130 with the gate dielectric film 152 and the inner insulating spacers 120 therebetween. At least some of the plurality of inner insulating spacers 120 may overlap the outer insulating spacers 118 in the vertical direction (Z direction). Each of the plurality of source/drain regions 130 may be in contact with an adjacent one of the plurality of inner insulating spacers 120.

The inner insulating spacers 120 may include SiN, SiCN, SiBN, SiON, SiOCN, SiBCN, SiOC, SiO, or a combination thereof. The inner insulating spacers 120 may include an air gap. In an example embodiment, the outer insulating spacers 118 and the inner insulating spacers 120 may include the same material. In another example embodiment, the outer insulating spacers 118 may include a different material from the inner insulating spacers 120.

Each of the plurality of source/drain regions 130 may include portions in contact with ones of the plurality of outer insulating spacers 118, which are adjacent thereto, and portions in contact with ones of the plurality of inner insulating spacers 120, which are adjacent thereto.

In each of the plurality of source/drain regions 130, at least one of the plurality of stacking fault surfaces 134 may linearly extend from a surface of the inner insulating spacer 120, which is in contact with the source/drain region 130, through the single crystalline semiconductor body 132 toward the inside of the source/drain region 130. In each of the plurality of source/drain regions 130, at least one of the plurality of stacking fault surfaces 134 may linearly extend from a surface of the outer insulating spacer 118, which is in contact with the source/drain region 130, through the single crystalline semiconductor body 132 toward the inside of the source/drain region 130.

From among the plurality of stacking fault surfaces 134 included in the source/drain region 130, the stacking fault surface 134 extending from the surface of the inner insulating spacer 120 may be closer to the substrate 102 than the stacking fault surface 134 extending from the surface of the outer insulating spacer 118.

As used herein, from among the plurality of stacking fault surfaces 134 included in the source/drain region 130, the stacking fault surface 134 extending from the surface of the inner insulating spacer 120 may be referred to as a "lower stacking fault surface," and the stacking fault surface 134 extending from the surface of the outer insulating spacer 118 may be referred to as an "upper stacking fault surface." One source/drain region 130 may include a plurality of lower stacking fault surfaces and a plurality of upper stacking fault surfaces.

An angle between each of the plurality of lower stacking fault surfaces and an arbitrary line in the first lateral direction (X direction) (and likewise between each of the plurality of upper stacking fault surfaces and the arbitrary line in the first lateral direction (X direction)) may be in a range of about 45° to about 65°, e.g., about 50° to about 60°, which corresponds to the above-described range of the first angle A1. An angle between each of the plurality of lower stacking fault surfaces and a straight line in the vertical direction (Z direction) (and likewise between each of the plurality of upper stacking fault surfaces and the straight line in the vertical direction (Z direction)) may have an angle of about 25° to about 45°, e.g., about 30° to about 40°, which corresponds to the above-described range of each of the second angles A21 and A22.

In an example embodiment, an angle between a sidewall of the inner insulating spacer 120, which contacts the source/drain region 130, and the lower stacking fault surface extending from the sidewall of the inner insulating spacer 120 toward the inside of the source/drain region 130 may be in a range of about 25° to about 45°, e.g., about 30° to about 40°, which corresponds to the above-described range of each of the second angles A21 and A22.

In an example embodiment, the plurality of stacking fault surfaces 134 included in one source/drain region 130 may include at least two stacking fault surfaces 134, which extend in directions that intersect with each other. Each of the at least two stacking fault surfaces 134 may include the lower stacking fault surface or the upper stacking fault surface. That is, the plurality of lower stacking fault surfaces and the plurality of upper stacking fault surfaces may include at least two stacking fault surfaces 134, which extend in directions that intersect with each other.

For example, referring to FIG. 2B, the plurality of stacking fault surfaces 134 included in the source/drain region 130 may include a first lower stacking fault surface 134A and a second lower stacking fault surface 134B, which extend in directions that intersect with each other. One end of each of the first lower stacking fault surface 134A and the second lower stacking fault surface 134B may be in contact with the inner insulating spacer 120.

An angle between each of the first lower stacking fault surface 134A and the second lower stacking fault surface 134B and the straight line in the first lateral direction (X direction) may be in a range of about 50° to about 60°, e.g., about 54.7°. An angle between each of the first lower stacking fault surface 134A and the second lower stacking fault surface 134B and the straight line in the vertical direction (Z direction) may be in a range of about 30° to about 40°, e.g., 35.3°.

In an example embodiment, in each of the plurality of source/drain regions 130, a density or concentration of the plurality of stacking fault surfaces 134 may increase toward the center of the source/drain region 130 in the first lateral direction (X direction) from the first to third nanosheets N1, N2, and N3, which are in contact with the source/drain region 130.

Referring to FIGS. 2A and 2B, each of the plurality of source/drain regions 130 may not include a portion overlapping the outer insulating spacer 118 in the vertical direction (Z direction). In another example embodiment, unlike those shown in FIGS. 2A and 2B, each of the plurality of source/drain regions 130 may include a portion overlapping the outer insulating spacer 118 in the vertical direction (Z direction). For example, a portion of each of the plurality of source/drain regions 130, which overlaps the outer insulating spacer 118 in the vertical direction (Z direction), may have a width selected in a range of about 0 nm to about 4 nm in the first lateral direction (X direction). In an example embodiment, each of the plurality of source/drain regions 130 may not include a portion overlapping the main gate portion 160M in the vertical direction (Z direction).

Between the first to third nanosheets N1, N2, and N3 and between the fin-type active region FA and the first nanosheet N1, both sidewalls of each of the plurality of sub-gate portions 160S may be apart from the source/drain region 130 with the gate dielectric film 152 and the inner insulating spacer 120 therebetween. The gate dielectric film 152 may not include a portion in contact with the source/drain region 130. Each of the plurality of source/drain regions 130 may face the nanosheet stack NSS and the plurality of sub-gate portions 160S in the first lateral direction (X direction).

Referring to FIGS. 2A and 2B, the plurality of outer insulating spacers 118 and the plurality of source/drain regions 130 may be covered by a protective insulating film 142. The protective insulating film 142 may include SiN, SiO, SiCN, SiBN, SiON, SiOCN, SiBCN, SiOC, or a combination thereof. In an example embodiment, the protective insulating film 142 may be in contact with a top surface of the source/drain region 130. In another example embodiment, the protective insulating film 142 may be omitted.

An inter-gate dielectric film 144 may be formed on the protective insulating film 142.

The inter-gate dielectric film 144 may include SiN, SiO, SiON, SiOCN, or a combination thereof. When the protective insulating film 142 is omitted, the inter-gate dielectric film 144 may be in contact with the source/drain region 130.

As described above, each of the plurality of source/drain regions 130 included in the IC device 100 may include the single crystalline semiconductor body 132 and the stacking fault surface 134, which linearly extends from the plurality of inner insulating spacers 120 and/or the outer insulating spacers 118 adjacent to each of the plurality of source/drain regions 130 through the single crystalline semiconductor body 132 toward the inside of the source/drain region 130. The source/drain region 130 including the stacking fault surface 134 may apply strain to the first to third nanosheets N1, N2, and N3, which are in contact with the source/drain region 130. As a result, tensile stress may be applied by the source/drain region 130 to the first to third nanosheets N1, N2, and N3, and the mobility of carriers in a channel region provided in the first to third nanosheets N1, N2, and N3 may be increased, and thus, the performance of the transistor TR may be improved. Accordingly, the reliability and/or performance of the IC device 100 may be improved.

Figure 3:
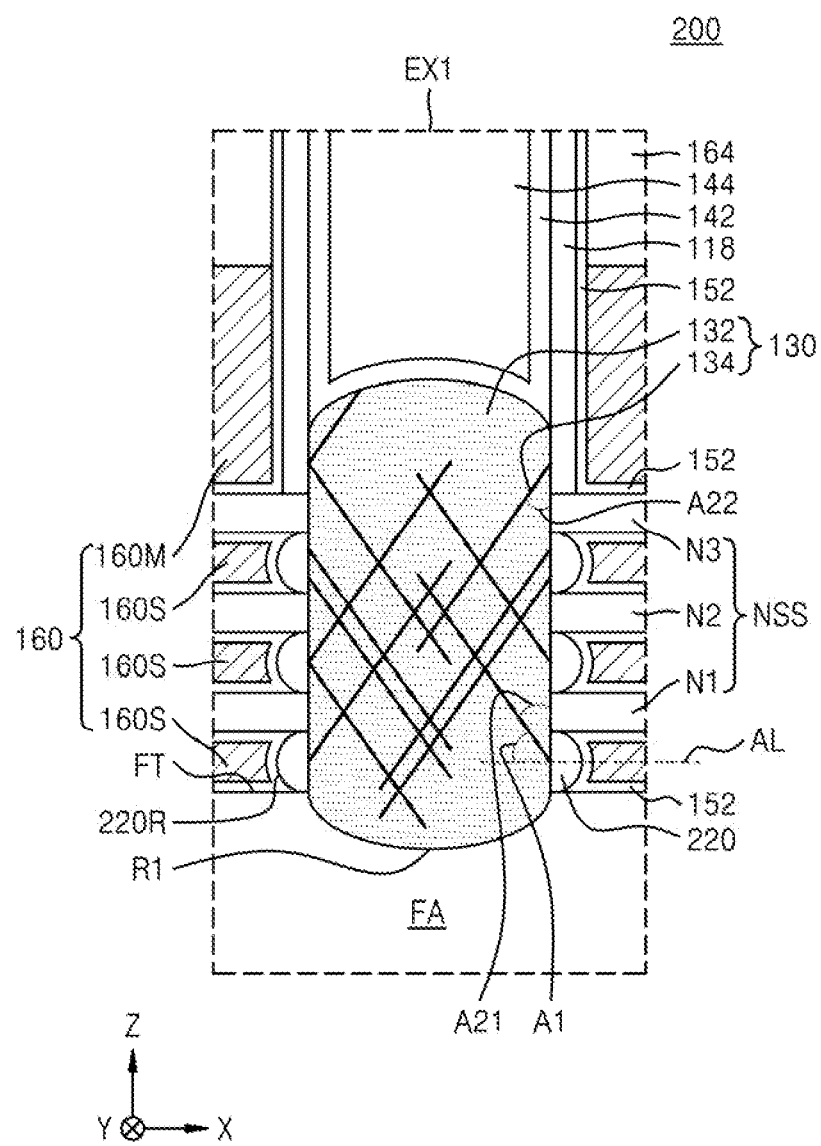
FIG. 3 is a cross-sectional view of an IC device according to an example embodiment.

FIG. 3 is a cross-sectional view of an IC device 200 according to another example embodiment. FIG. 3 illustrates the IC device 200 for a partial region that corresponds to the partial region "EX1" of FIG. 2A in the IC device 100.

Referring to FIG. 3, the IC device 200 may have substantially the same configuration as the IC device 100 described with reference to FIGS. 1 and 2A to 2C. However, the IC device 200 may include a plurality of inner insulating spacers 220 instead of the plurality of inner insulating spacers 120 included in the IC device 100.

The plurality of inner insulating spacers 220 may have substantially the same configuration as the plurality of inner insulating spacers 120 described with reference to FIGS. 2A and 2B, except that each of the plurality of inner insulating spacers 220 may include a nonlinear surface 220R facing a sub-gate portion 160S. The nonlinear surface 220R may include a convex round surface toward the sub-gate portion 160S. The nonlinear surface 220R of the inner insulating spacer 220 may be in contact with a gate dielectric film 152.

Figure 4:
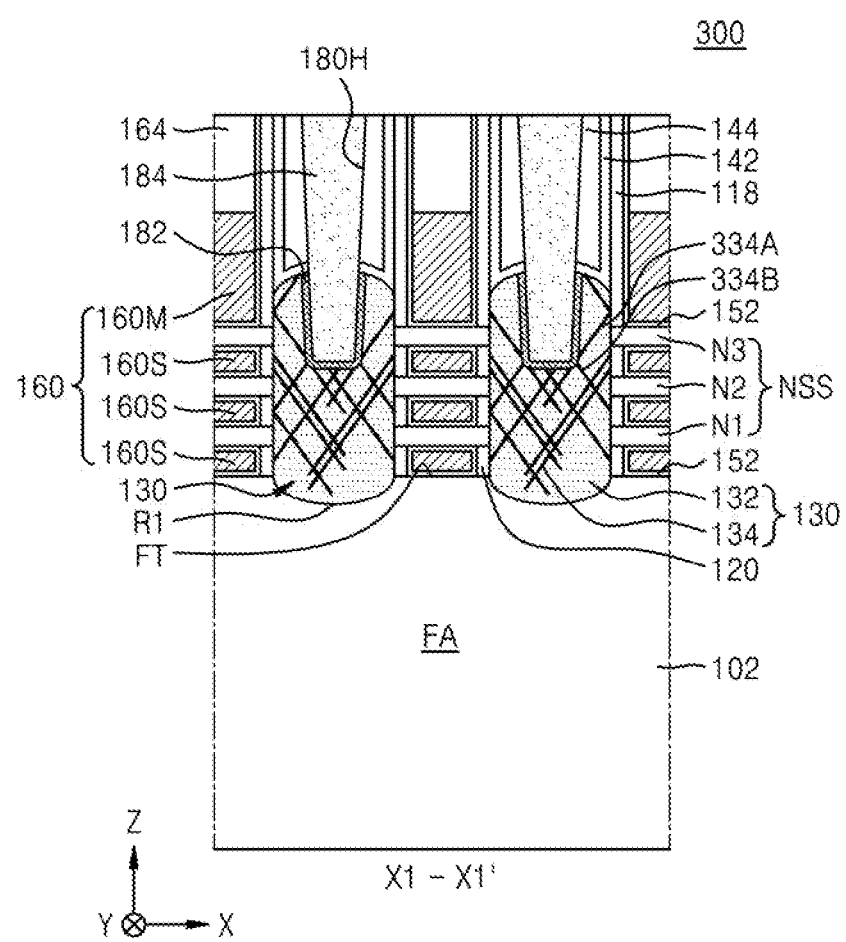
FIG. 4 is a cross-sectional view of an IC device according to an example embodiment.

FIG. 4 is a cross-sectional view of an IC device 300 according to another example embodiment. FIG. 4 illustrates a partial configuration of the IC device 300 for a region corresponding to the line X1-X1' of FIG. 1 of the IC device 100.

Referring to FIG. 4, the IC device 300 may have substantially the same configuration as the IC device 100 described with reference to FIGS. 1 and 2A to 2C, except that the IC device 300 may further include a plurality of source/drain contacts 184 on the plurality of source/drain regions 130.

The IC device 300 may include a metal silicide film 182 between the source/drain region 130 and the source/drain contact 184. Each of the plurality of source/drain contacts 184 may fill a contact hole 180H, which passes through an inter-gate dielectric film 144 and a protective insulating film 142 in a vertical direction (Z direction) and extends into the source/drain region 130. The source/drain region 130 may be apart from the source/drain contact 184 with the metal silicide film 182 therebetween. The source/drain region 130 may surround a lower portion of each of the plurality of source/drain contacts 184 outside the contact hole 180H.

A portion of the source/drain region 130, which surrounds the metal silicide film 182 and the source/drain contact 184, may include the single crystalline semiconductor body 132 and the plurality of stacking fault surfaces 134, each of which linearly extends through at least a portion of the single crystalline semiconductor body 132.

The plurality of stacking fault surfaces 134 may include a first stacking fault surface 334A and a second stacking fault surface 334B, which extend to the metal silicide film 182. The first stacking fault surface 334A may have one end in contact with an outer insulating spacer 118 adjacent thereto and another end in contact with the metal silicide film 182. The second stacking fault surface 334B may have one end in contact with an inner insulating spacer 120 adjacent thereto and another end in contact with the metal silicide film 182.

Figure 5:
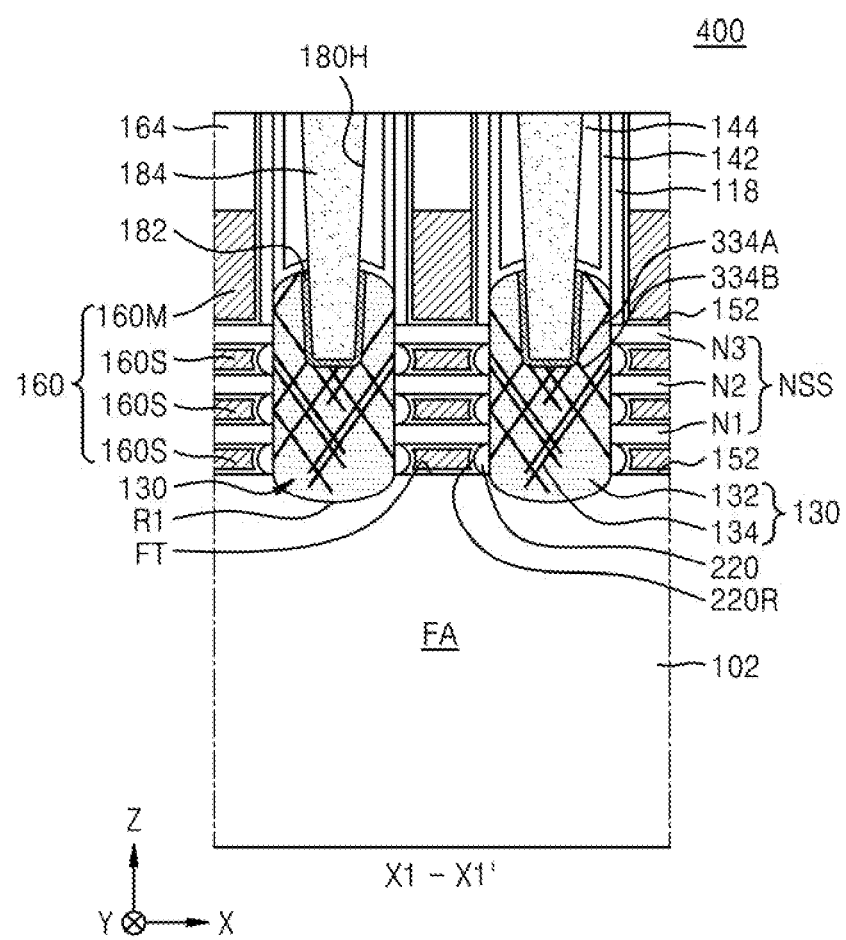
FIG. 5 is a cross-sectional view of an IC device according to an example embodiment.

FIG. 5 is a cross-sectional view of an IC device 400 according to another example embodiment. FIG. 5 illustrates a partial configuration of the IC device 400 for a region corresponding to the line X1-X1' of FIG. 1 of the IC device 100.

Referring to FIG. 5, the IC device 400 may have substantially the same configuration as the IC device 300 described with reference to FIG. 4, except that the IC device 400 may include a plurality of inner insulating spacers 220 instead of the plurality of inner insulating spacers 120 included in the IC device 300. A detailed description of the plurality of inner insulating spacers 220 may be the same as that provided with reference to FIG. 3.

Figure 6:
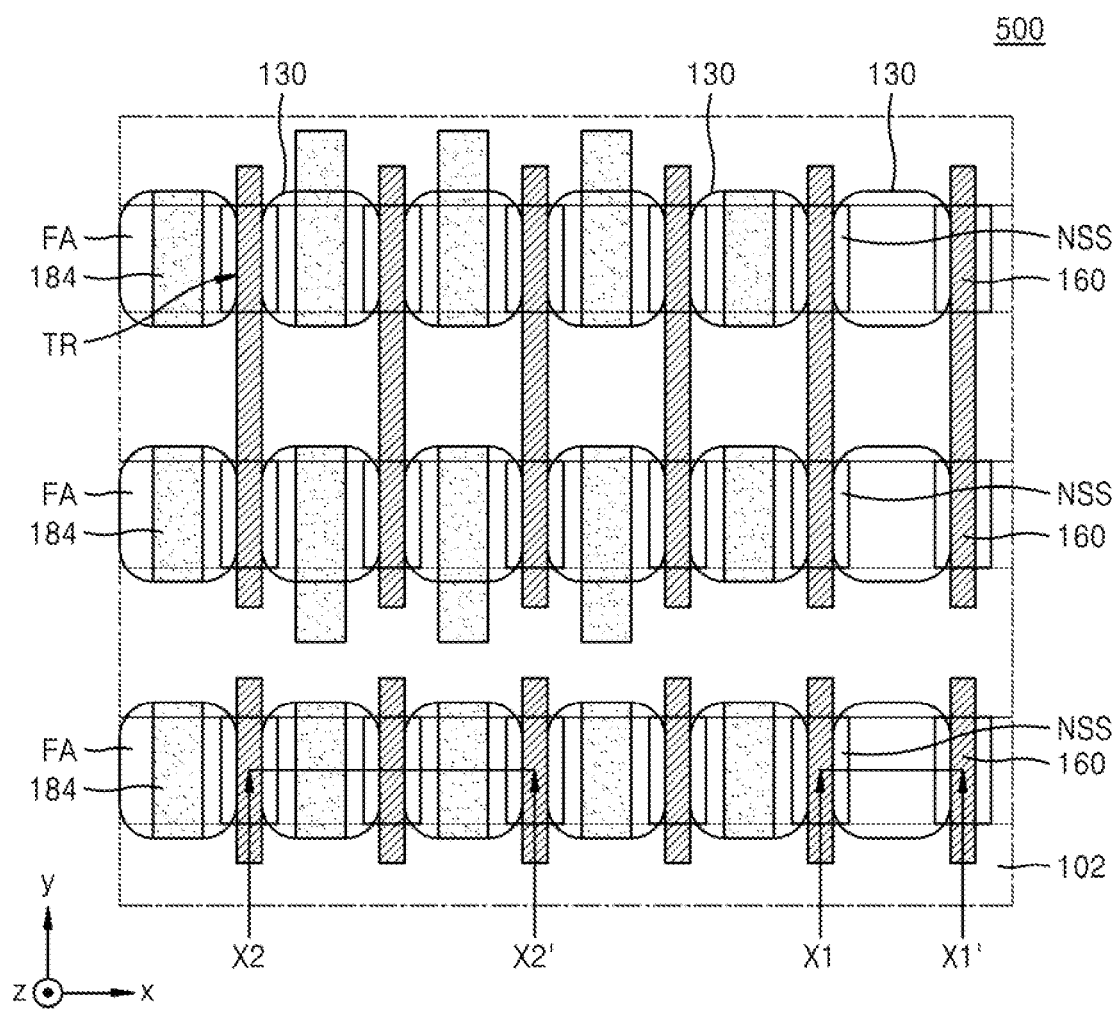
FIG. 6 is a plan layout diagram of an IC device according to an example embodiment.

FIG. 6 is a plan layout diagram of an IC device 500 according to an example embodiment. In FIG. 6, the same reference numerals are used to denote the same elements as in FIGS. 1 to 5, and repeated descriptions thereof are omitted.

Referring to FIG. 6, the IC device 500 may include a plurality of fin-type active regions FA and a plurality of gate lines 160. The plurality of fin-type active regions FA may protrude from the substrate 102 in a vertical direction (Z direction) and extend long in a first lateral direction (X direction). The plurality of gate lines 160 may extend long in the second lateral direction (Y direction) on the plurality of fin-type active regions FA. A plurality of nanosheet stacks NSS may be respectively on fin top surfaces of the plurality of fin-type active regions FA at intersections between the plurality of fin-type active regions FA and the plurality of gate lines 160. A plurality of transistors TR may be formed at the intersections between the plurality of fin-type active regions FA and the plurality of gate lines 160 on the substrate 102.

A plurality of source/drain regions 130 may be at positions adjacent to the gate lines 160 on the plurality of fin-type active regions FA. Source/drain contacts 184 may be on some of the plurality of source/drain regions 130 and connected to the source/drain region 130. The source/drain contacts 184 may not be on the remaining ones of the plurality of source/drain regions 130.

In an example embodiment, a cross-sectional configuration taken along line X1-X1' of FIG. 6 may be the same as or similar to any one of the configurations described with reference to FIGS. 2B and 3. In an example embodiment, a cross-sectional configuration taken along line X2-X2' of FIG. 6 may be the same as or similar to any one of the configurations described with reference to FIGS. 4 and 5.

Each of the source/drain regions 130 included in the IC devices 100, 200, 300, 400, and 500 described with reference to FIGS. 1 to 6 may include the single crystalline semiconductor body 132 and the stacking fault surface 134. The stacking fault surface 134 may linearly extend from a plurality of inner insulating spacers 120 and/or a plurality of outer insulating spacers 118, which are adjacent to each of the source/drain regions 130, through the single crystalline semiconductor body 132 toward the inside of the source/drain region 130. The source/drain region 130 including the stacking fault surface 134 may apply strain to the first to third nanosheets N1, N2, and N3, which are in contact with the source/drain region 130, and thus, the mobility of carriers in a channel region provided in the first to third nanosheets N1, N2, and N3 may be increased. Accordingly, the performance of the transistor TR including the source/drain region 130 may be improved, and the reliability and/or performance of the IC devices 100, 200, 300, 400, and 500 may be improved.

FIGS. 7A to 7M are cross-sectional views of a process sequence of a method of manufacturing an IC device, according to an example embodiment. An example method of manufacturing the IC device 100 shown in FIGS. 1 and 2A to 2C will now be described with reference to FIGS. 7A to 7M. In FIGS. 7A to 7M, the same reference numerals are used to denote the same elements as in FIGS. 1, 2A, and 2B, and repeated descriptions thereof are omitted.

Figure 7A:
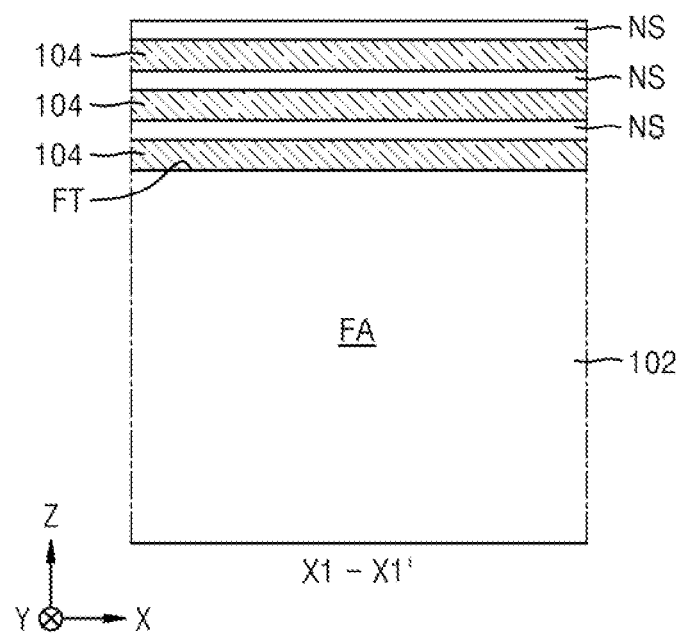
FIGS. 7A to 7M are cross-sectional views of a process sequence of a method of manufacturing an IC device, according to an example embodiment.

Referring to FIG. 7A, a plurality of sacrificial semiconductor layers 104 and a plurality of nanosheet semiconductor layers NS may be alternately stacked one by one on a substrate 102. Thereafter, the plurality of sacrificial semiconductor layers 104, the plurality of nanosheet semiconductor layers NS, and a portion of the substrate 102 may be etched to define a plurality of fin-type active regions FA in the substrate 102.

Afterwards, a device isolation film 114 (not shown in FIG. 7A; see FIG. 1) may be formed to cover a sidewall of each of the plurality of fin-type active regions FA. A top surface of the device isolation film 114 may be at substantially the same level as or a similar level to fin top surfaces FT of the fin-type active regions FA.

A stack structure of the plurality of sacrificial semiconductor layers 104 and the plurality of nanosheet semiconductor layers NS may remain on the fin top surface FT of each of the plurality of fin-type active regions FA.

The plurality of sacrificial semiconductor layers 104 may include a semiconductor material having a different etch selectivity from the plurality of nanosheet semiconductor layers NS. In an example embodiment, the plurality of nanosheet semiconductor layers NS may include a Si layer, while the plurality of sacrificial semiconductor layers 104 may include a SiGe layer. In an example embodiment, the plurality of sacrificial semiconductor layers 104 may have a constant Ge content. The SiGe layer included in the plurality of sacrificial semiconductor layers 104 may have a constant Ge content selected in a range of about 5 atom % to about 60 atom %, e.g., a range of about 10 atom % to about 40 atom %. The Ge content of the SiGe layer included in the plurality of sacrificial semiconductor layers 104 may be variously selected.

Figure 7B:
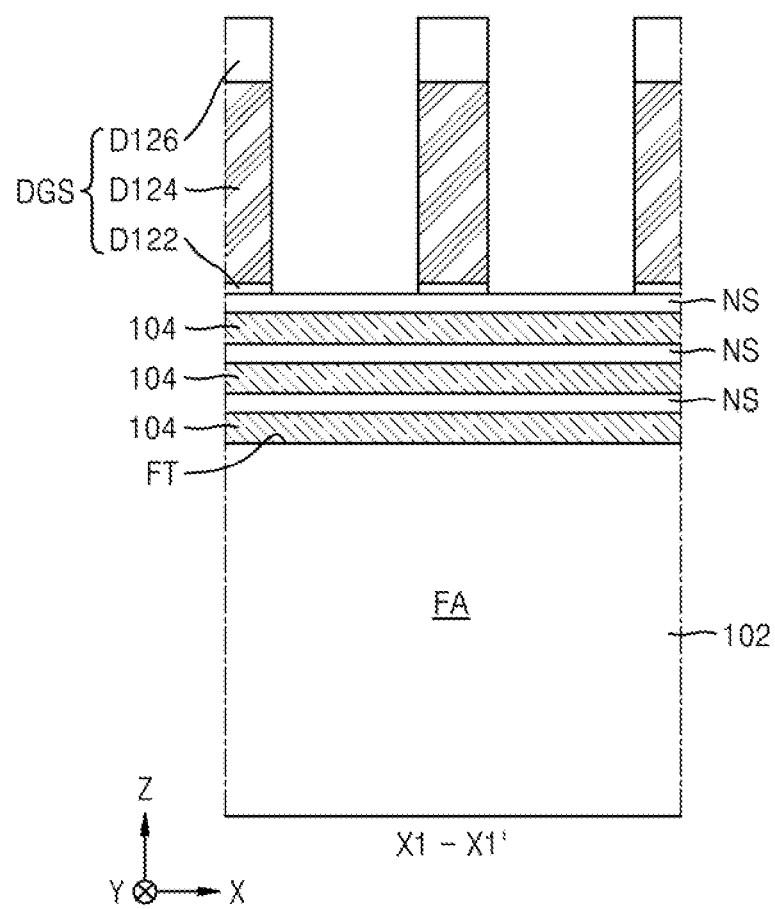

Referring to FIG. 7B, a plurality of dummy gate structure DGS may be formed on the stack structure of the plurality of sacrificial semiconductor layers 104 and the plurality of nanosheet semiconductor layers NS.

Each of the plurality of dummy gate structures DGS may extend long in a second lateral direction (Y direction). Each of the plurality of dummy gate structures DGS may include an oxide film D122, a dummy gate layer D124, and a capping layer D126, which are sequentially stacked on the substrate 102. In an example embodiment, the dummy gate layer D124 may include polysilicon, and the capping layer D126 may include a silicon nitride film.

Figure 7C:
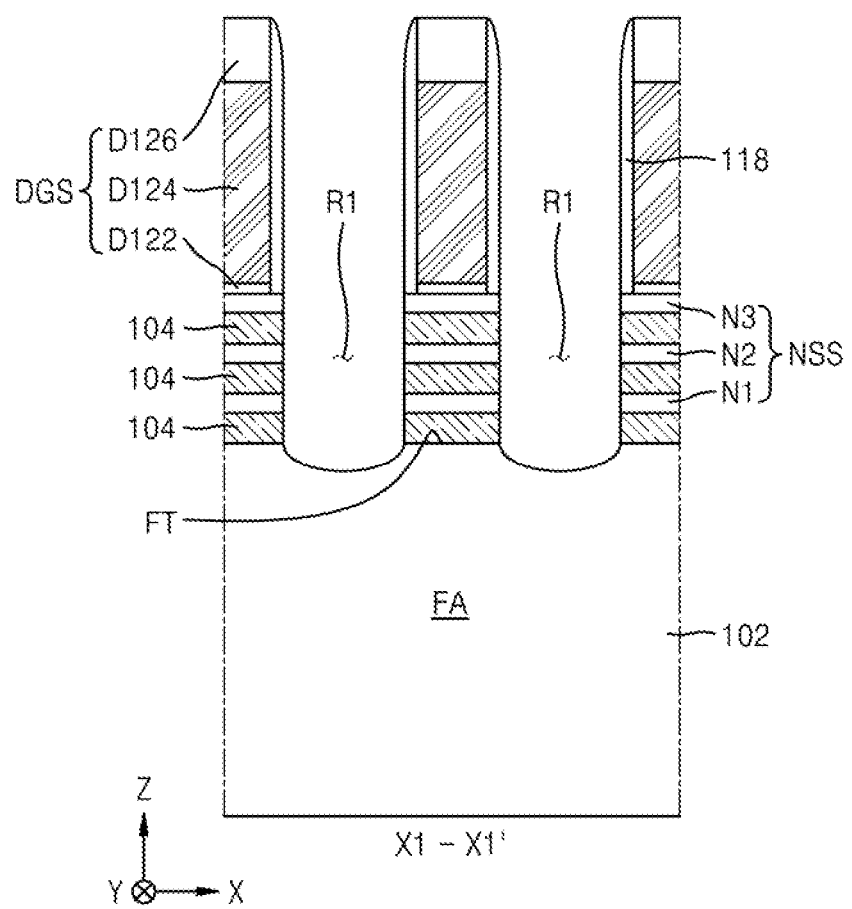

Referring to FIG. 7C, a plurality of outer insulating spacers 118 may be formed to cover both sidewalls of each of the plurality of dummy gate structure DGS. Thereafter, a portion of each of the plurality of sacrificial semiconductor layers 104 and the plurality of nanosheet semiconductor layers NS may be removed using the plurality of dummy gate structures DGS and the plurality of outer insulating spacers 118 as etch masks. Thus, the plurality of nanosheet semiconductor layers NS may be divided into the plurality of nanosheet stacks NSS. Each of the plurality of nanosheet stacks NSS may include a plurality of nanosheets (e.g., N1, N2, and N3). Thereafter, the fin-type active region FA exposed between the plurality of nanosheet stacks NSS may be etched to form the plurality of recesses R1 in an upper portion of the fin-type active region FA. To form the plurality of recesses R1, the fin-type active region FA may be etched using a dry etching process, a wet etching process, or a combination thereof.

Figure 7D:
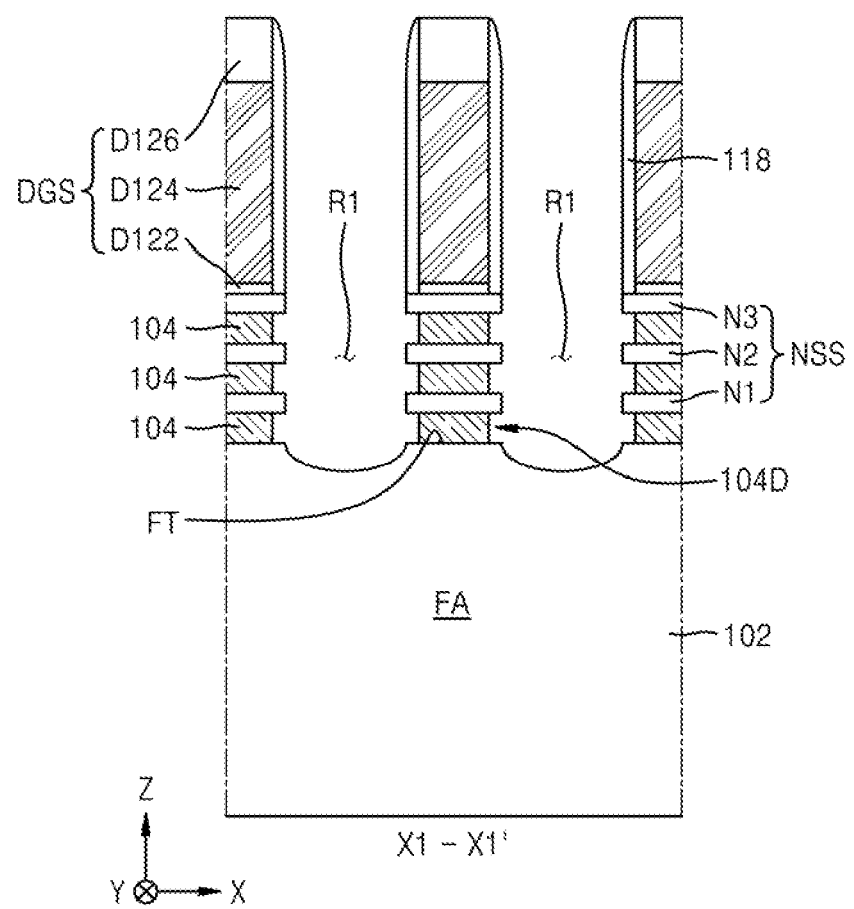

Referring to FIG. 7D, the plurality of sacrificial semiconductor layers 104 exposed by the plurality of recesses R1 on both sides of each of the plurality of nanosheet stacks NSS may be partially removed and thus, a plurality of indent regions 104D may be formed between the first to third nanosheets N1, N2, and N3 and between the first nanosheet N1 and the fin-type active region FA. To form the plurality of indent regions 104D, portions of the plurality of sacrificial semiconductor layers 104 may be selectively etched by using an etch selectivity between the plurality of sacrificial semiconductor layers 104 and the first to third nanosheets N1, N2, and N3.

Figure 7E:
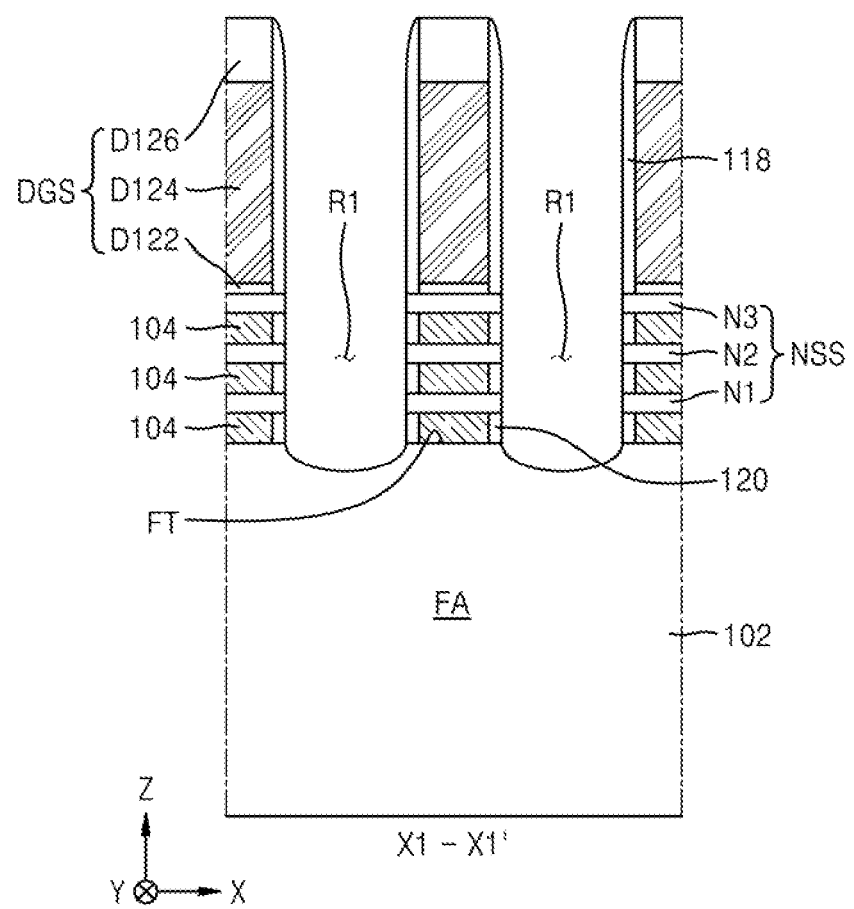

Referring to FIG. 7E, a plurality of inner insulating spacers 120 may be formed to fill the plurality of indent regions 104D in the resultant structure of FIG. 7D. To form the plurality of inner insulating spacers 120, an atomic layer deposition (ALD) process, a chemical vapor deposition (CVD) process, an oxidation process, or a combination thereof may be used.

Figure 7F:
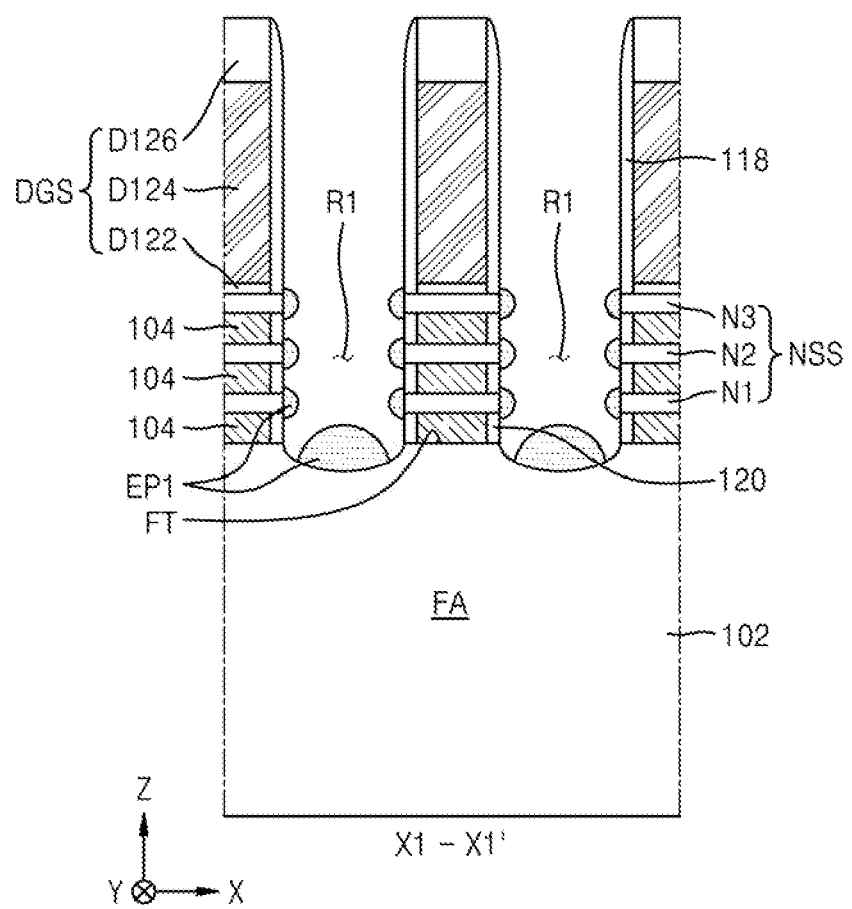
Figure 7G:
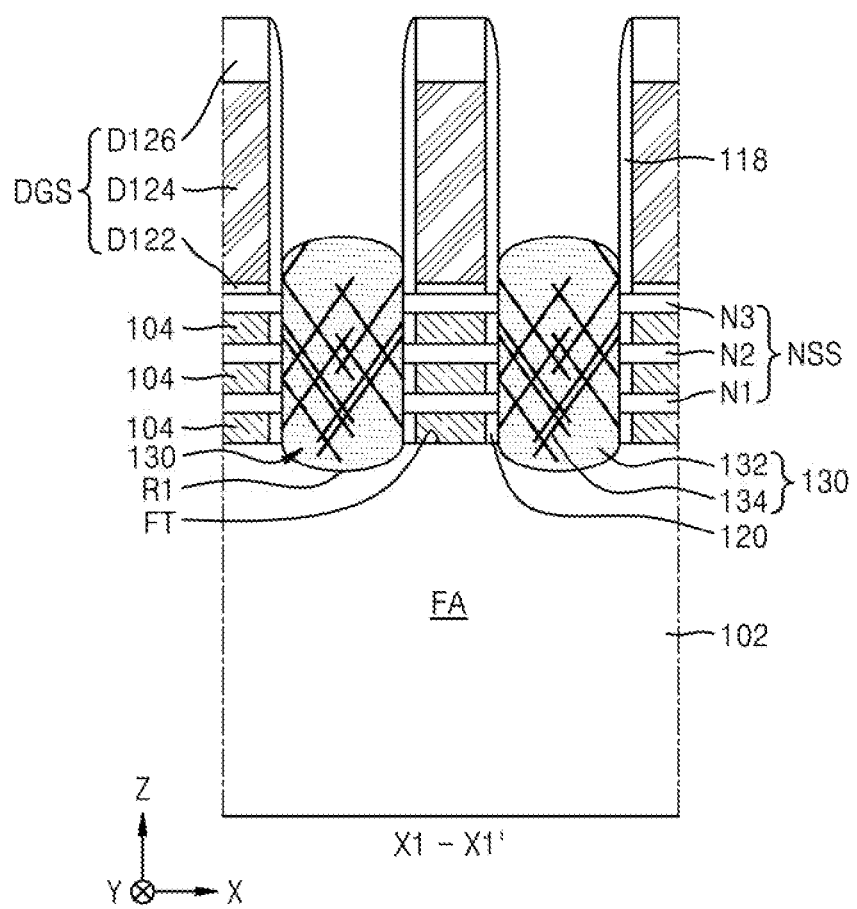

Referring to FIGS. 7F and 7G, a selective epitaxial growth (SEG) process for forming a plurality of source/drain regions 130 may be performed on the fin-type active region FA on both sides of each of the plurality of nanosheet stacks NSS. FIG. 7F illustrates a state of an initial stage of the SEG process, and FIG. 7G illustrates a state in which the plurality of source/drain regions 130 are formed on the fin-type active region FA after the SEG process ends.

As shown in FIG. 7F, in the initial stage of the SEG process, a semiconductor film EP1 may be epitaxially grown on a surface of the fin-type active region FA exposed at a bottom of the recess R1 and a sidewall of each of the first to third nanosheets N1, N2, and N3. The semiconductor film EP1 may include silicon doped with n-type impurities. Thereafter, as the SEG process proceeds, the semiconductor film EP1 may be gradually grown to obtain the plurality of source/drain regions 130 shown in FIG. 7G.

During the epitaxial growth of the semiconductor film EP1 to form the plurality of source/drain regions 130, a portion of the semiconductor film EP1, which is epitaxially grown on the surface of the fin-type active region FA and the sidewall of each of the first to third nanosheets N1, N2, and N3, may constitute a single crystalline semiconductor body 132 of each of the plurality of source/drain regions 130.

In addition, during the epitaxial growth of the semiconductor film EP1, in partial regions of portions grown from an insulating surface of each of the plurality of inner insulating spacers 120 and an insulating surface of each of the plurality of outer insulating spacers 118, a plurality of stacking faults (stacking faults) may occur due to differences between a lattice structure of an insulating material (e.g., silicon nitride) included in the insulating surfaces and a lattice structure of semiconductor atoms (e.g., silicon atoms) epitaxially grown on the insulating surfaces.

During the epitaxial growth process, the plurality of stacking faults may continuously propagate from the insulating surfaces through the single crystalline semiconductor body 132. Thus, after the source/drain region 130 is formed, the plurality of stacking faults may be left as a plurality of stacking fault surfaces 134 in the source/drain region 130.

In an example embodiment, a first angle between a direction of each of the plurality of stacking fault surfaces 134 and a {100} surface orientation of the substrate 102 may be in a range of about 45° to about 65°. In an example embodiment, a second angle between the direction of each of the plurality of stacking fault surfaces 134 and the {110} orientation of the substrate 102 may be selected in a range of about 45° to about 65°. The second angle may be less than the first angle. The first angle and the second angle may be the same as the first angle A1 and the second angles A21 and A22 described with reference to FIG. 2B.

In an example embodiment, to form the source/drain region 130 using the SEG process, source materials including an element semiconductor precursor may be used. The element semiconductor precursor may include a Si element. When the source/drain region 130 includes a silicon film, a Si source may be used to form the source/drain region 130. Silane ($SiH_4$), disilane ($Si_2H_6$), trisilane ($Si_3H_8$), dichlorosilane ($SiH_2Cl_2$), or the like may be used as the Si source. In an example embodiment, when the source/drain region 130 includes a phosphorus (P)-doped silicon film, to form the P-doped silicon film, a P source may be further used in addition to the Si source. Phosphorus oxychloride ($POCl_3$) may be used as the P source. In an example embodiment, during the epitaxial growth process for forming the source/drain regions 130, a P-dopant ion implantation process using the P source may be performed in-situ.

In an example embodiment, during the epitaxial growth process for forming the source/drain regions 130, process conditions, such as temperature, pressure, types of source gases, and flow rates of supply gases, may be adjusted to control the number or density of stacking fault surfaces 134 included in the plurality of source/drain regions 130. By controlling the number or density of stacking fault surfaces 134 included in the plurality of source/drain regions 130, strain applied from the plurality of source/drain regions 130 to the first to third nanosheets N1, N2, and N3 may be controlled to a desired degree in the IC device 100.

Figure 7H:
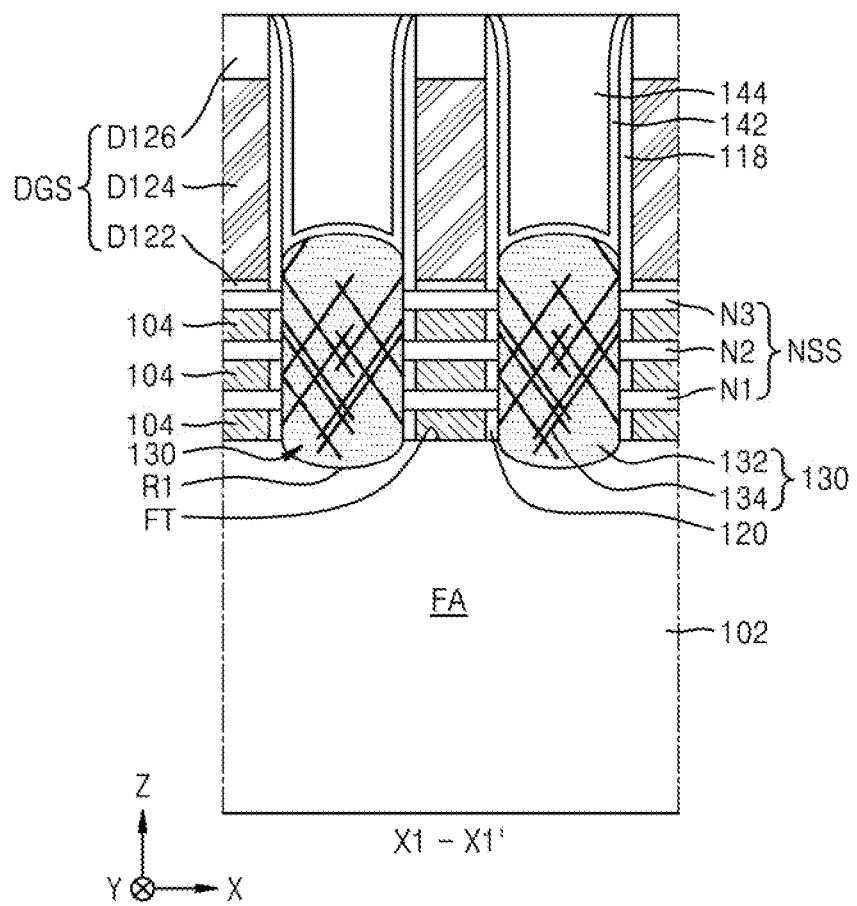

Referring to FIG. 7H, a protective insulating film 142 may be formed to cover the resultant structure of FIG. 7G in which the plurality of source/drain regions 130 are formed, and an inter-gate dielectric film 144 may be formed on the protective insulating film 142. The protective insulating film 142 and the inter-gate dielectric film 144 may be planarized to expose a top surface of the capping layer D126.

Figure 7I:
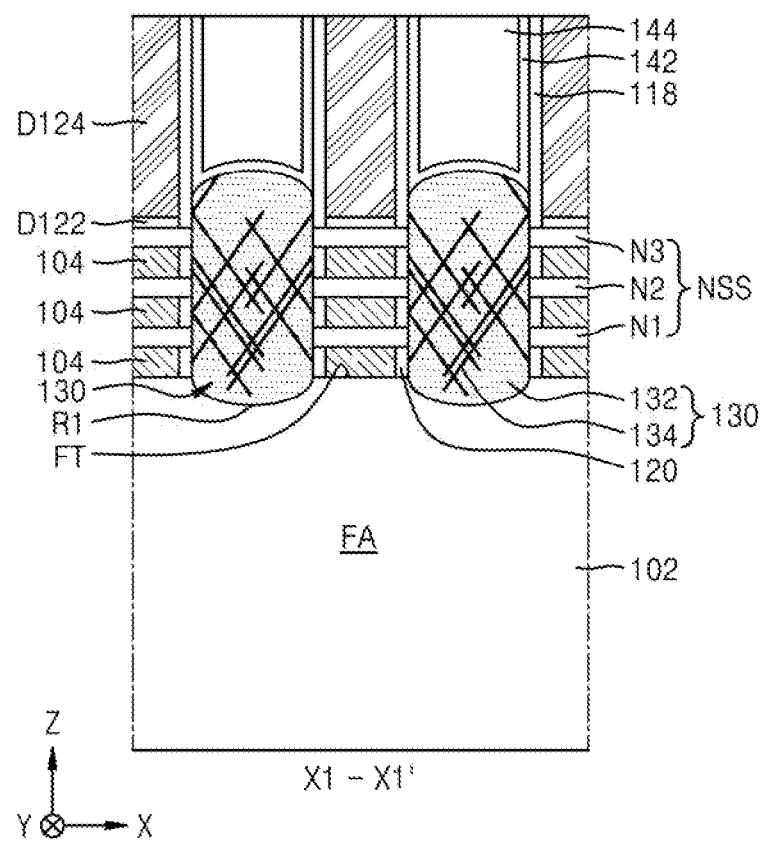

Referring to FIG. 7I, the capping layer D126 may be removed from the resultant structure of FIG. 7H to expose a top surface of the dummy gate layer D124. The protective insulating film 142 and the inter-gate dielectric film 144 may be partially removed such that a top surface of the inter-gate dielectric film 144 ends up at substantially the same level as a top surface of the dummy gate layer D124.

Figure 7J:
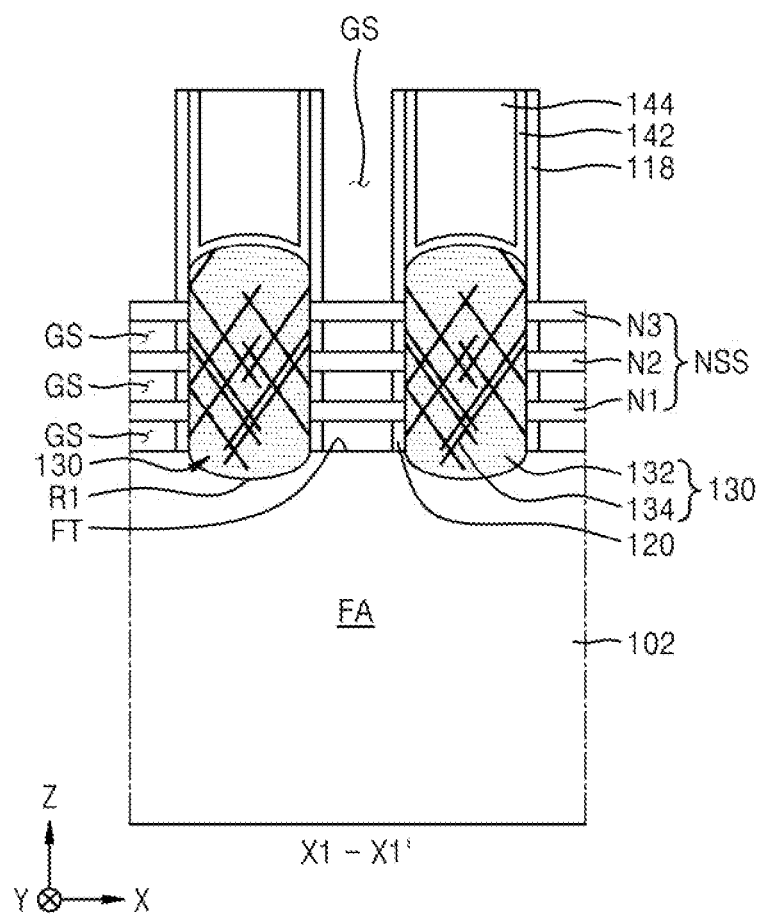

Referring to FIG. 7J, the dummy gate layer D124 and the oxide film D122 located thereunder may be removed from the resultant structure of FIG. 7I to prepare a gate space GS, and the plurality of nanosheet stacks NSS may be exposed through the gate space GS. Thereafter, the plurality of sacrificial semiconductor layers (refer to 104 in FIG. 7I) remaining on the fin-type active region FA may be removed through the gate space GS, and thus, the gate space GS may expand to respective spaces between the first to third nanosheets N1, N2, and N3 and a space between the first nanosheet N1 and the fin top surface FT.

In an example embodiment, to selectively remove the plurality of sacrificial semiconductor layers 104, an etch selectivity between the first to third nanosheets N1, N2, and N3 and the plurality of sacrificial semiconductor layers 104 may be used. To selectively remove the plurality of sacrificial semiconductor layers 104, a liquid or gaseous etchant may be used. In an example embodiment, to selectively remove the plurality of sacrificial semiconductor layers 104, a $CH_3COOH$-based etchant, e.g., an etchant including a mixture of $CH_3COOH$, $HNO_3$, and HF or an etchant including a mixture of $CH_3COOH$, $H_2O_2$, and HF, may be used.

Figure 7K:
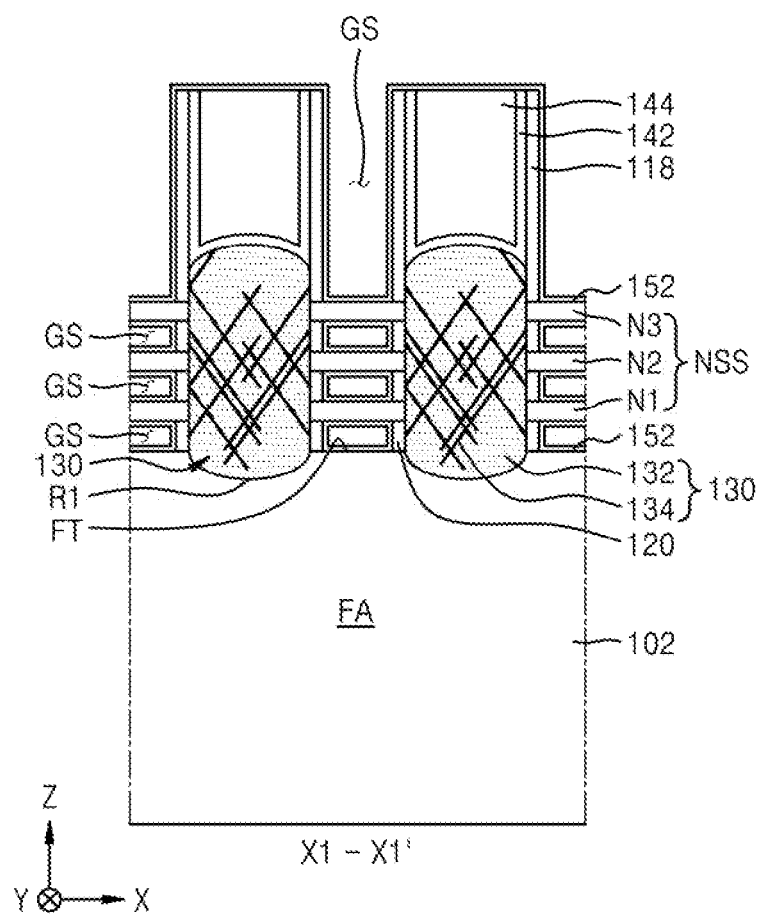

Referring to FIG. 7K, a gate dielectric film 152 may be formed to cover exposed surfaces of the first to third nanosheets N1, N2, and N3 and the fin-type active region FA. To form the gate dielectric film 152, an ALD process may be used.

Figure 7L:
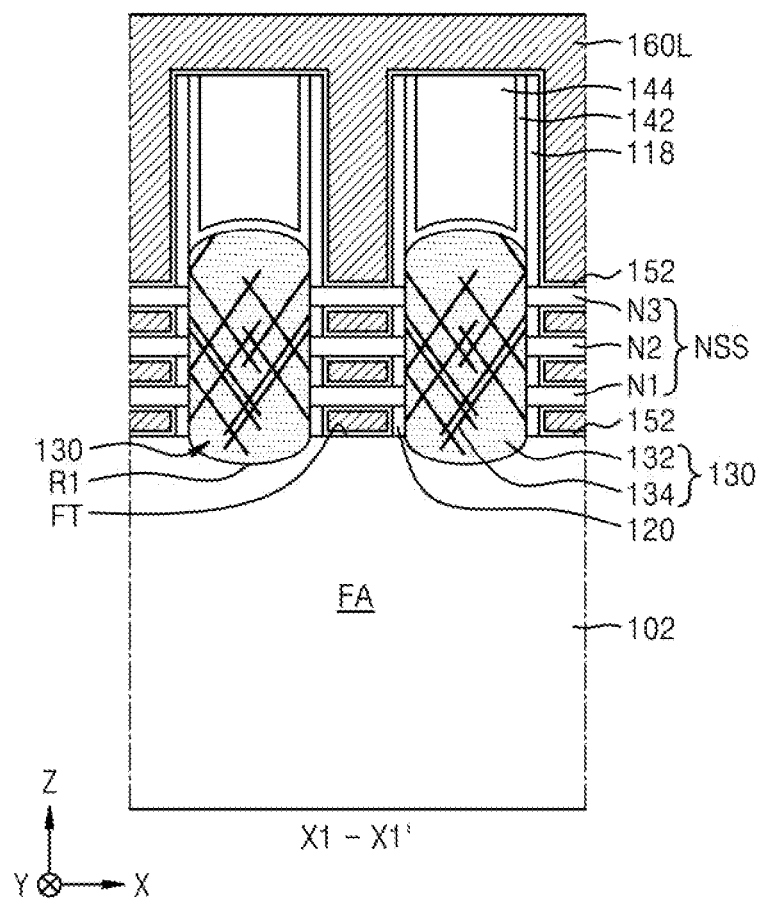

Referring to FIG. 7L, a conductive layer 160L for forming gates may be formed on the gate dielectric film 152 to fill the gate space (refer to GS in FIG. 7K) and cover the top surface of the inter-gate dielectric film 144. The conductive layer 160L for forming gates may include a metal, a metal nitride, a metal carbide, or a combination thereof. To form the conductive layer 160L for forming gates, an ALD process or a CVD process may be used.

Figure 7M:
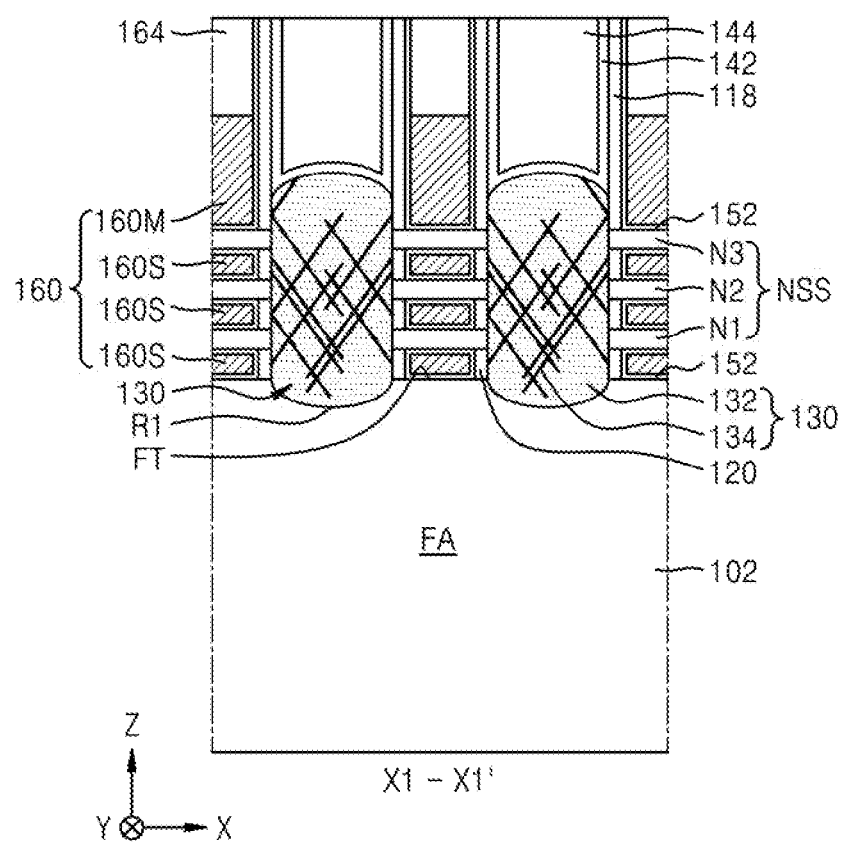

Referring to FIG. 7M, in the resultant structure of FIG. 7L, top surfaces of the conductive layer 160L for forming gates and the gate dielectric film 152 may be partially removed to expose to the surface of the inter-gate dielectric film 144 and empty an upper portion of the gate space GS again, thereby forming a gate line 160. Thereafter, the capping insulating pattern 164 may be formed on the gate line 160 to fill the gate space GS.

Although the method of manufacturing the IC device 100 shown in FIGS. 1 and 2A to 2C, according to an example embodiment, have been described with reference to FIGS. 7A to 7M, it will be understood that the IC devices 200, 300, 400, and 500 shown in FIGS. 3 to 6 and IC devices having variously modified and changed structures may be manufactured by applying various modifications and changes.

In an example embodiment, to manufacture the IC device 200 shown in FIG. 3, a process of forming the plurality of indent regions 104D may be performed as described with reference to FIG. 7D. However, when portions of the plurality of sacrificial semiconductor layers 104 are selectively etched to form the plurality of indent regions 104D, respective sidewalls of the plurality of sacrificial semiconductor layers 104, which are exposed through the plurality of indent regions 104D, may have convex round surfaces toward the recesses R1 by controlling an etching atmosphere. Thereafter, a plurality of inner insulating spacers 220 having non-linear surfaces 220R that are in contact with the convex round surfaces may be formed using a method similar to that described with reference to FIG. 7E. The processes described with reference to FIGS. 7F to 7M may be performed on the obtained resultant structure, and thus, the IC device 200 shown in FIG. 3 may be manufactured.

In an example embodiment, to manufacture the IC device 300 shown in FIG. 4, the processes described with reference to FIGS. 7A to 7M may be performed, and a portion of each of the inter-gate dielectric film 144, the protective insulating film 142, and the source/drain regions 130 may be etched to form a plurality of contact holes 180H exposing the plurality of source/drain regions 130. A metal silicide film 182 may be formed on respective surfaces of the plurality of source/drain regions 130, which are exposed through the plurality of contact holes 180H, and source/drain contacts 184 may be formed on the metal silicide film 182 to fill the contact holes 180.

By way of summation and review, with an increase in the integration density of the IC devices and a reduction in the size of the IC devices, it is important to develop a new structure capable of improving the performance and reliability in an FET having a gate-all-around structure including a silicon body of a nanowire or nanosheet type and a gate surrounding the silicon body.

As described above, embodiments relate to an IC device including a field-effect transistor (FET). Embodiments may provide an integrated circuit (IC) device exhibiting improved performance and reliability in a field-effect transistor (FET) having a gate-all-around structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
   a fin-type active region extending longitudinally in a first lateral direction on a substrate;
   a nanosheet disposed at a position apart from a fin top surface of the fin-type active region in a vertical direction, and facing the fin top surface;
   an inner insulating spacer between the substrate and the nanosheet;
   a gate line including a main gate portion and a sub-gate portion, the main gate portion extending longitudinally in a second lateral direction on the nanosheet, the sub-gate portion being integrally connected to the main gate portion and between the substrate and the nanosheet, wherein the second lateral direction intersects with the first lateral direction; and
   a source/drain region facing the sub-gate portion with the inner insulating spacer therebetween in the first lateral direction, the source/drain region being in contact with the inner insulating spacer and the nanosheet, the source/drain region including a single crystalline semiconductor body and at least one lower stacking fault surface linearly extending from the inner insulating spacer through the single crystalline semiconductor body toward an inside of the source/drain region,
   wherein the at least one stacking fault surface comprises a plurality of stacking fault surfaces, and
   wherein a density of the plurality of stacking fault surfaces increases toward a center of the source/drain region.

2. The integrated circuit device as claimed in claim 1, wherein the at least one lower stacking fault surface includes a first lower stacking fault surface and a second lower stacking fault surface, which extend in directions that intersect with each other.

3. The integrated circuit device as claimed in claim 1, wherein the single crystalline semiconductor body includes single crystalline silicon doped with n-type impurities.

4. The integrated circuit device as claimed in claim 1, wherein the at least one lower stacking fault surface includes a first lower stacking fault surface having an angle of about 50° to about 60° with respect to a straight line in the first lateral direction.

5. The integrated circuit device as claimed in claim 1, wherein the at least one lower stacking fault surface includes a first lower stacking fault surface having an angle of about 30° to about 40° with respect to a straight line in the vertical direction.

6. The integrated circuit device as claimed in claim 1, wherein the at least one lower stacking fault surface is parallel to a {111} crystal plane of the single crystalline semiconductor body.

7. The integrated circuit device as claimed in claim 1, further comprising an outer insulating spacer covering a sidewall of the gate line, the outer insulating spacer being in contact with the source/drain region,
wherein the source/drain region further includes at least one upper stacking fault surface extending from the outer insulating spacer toward an inside of the source/drain region.

8. The integrated circuit device as claimed in claim 7, wherein the at least one upper stacking fault surface includes a first upper stacking fault surface having an angle of about 50° to about 60° with respect to a straight line in the first lateral direction.

9. The integrated circuit device as claimed in claim 7, wherein the at least one upper stacking fault surface includes a first upper stacking fault surface and a second upper stacking fault surface, which extend in directions that intersect with each other.

10. The integrated circuit device as claimed in claim 7, wherein the at least one upper stacking fault surface is parallel to a {111} crystal plane of the single crystalline semiconductor body.

11. The integrated circuit device as claimed in claim 1, wherein:
each of the nanosheet and the substrate includes a silicon film, and
a first lattice constant of silicon lattices included in at least a partial region of the nanosheet is higher than a second lattice constant of silicon lattices included in at least a partial region of the substrate.

12. An integrated circuit device, comprising:
a fin-type active region extending longitudinally in a first lateral direction on a substrate;
a source/drain region on the fin-type active region;
first and second nanosheet stacks on a fin top surface of the fin-type active region, the first and second nanosheet stacks being apart from each other with the source/drain region therebetween in the first lateral direction, each of the first and second nanosheet stacks including a plurality of nanosheets overlapping each other in a vertical direction;
a first gate line surrounding the first nanosheet stack on the fin-type active region, the first gate line extending longitudinally in a second lateral direction intersecting with the first lateral direction;
a second gate line surrounding the second nanosheet stack on the fin-type active region, the second gate line extending longitudinally in the second lateral direction;
a first insulating spacer between the first gate line and the source/drain region; and
a second insulating spacer between the second gate line and the source/drain region,
wherein the source/drain region includes a single crystalline semiconductor body and a plurality of stacking fault surfaces linearly extending from the first insulating spacer and the second insulating spacer through the single crystalline semiconductor body toward an inside of the source/drain region, and
wherein a density of the plurality of stacking fault surfaces increases toward a center of the source/drain region.

13. The integrated circuit device as claimed in claim 12, wherein:
each of the first insulating spacer and the second insulating spacer includes an inner insulating spacer and an outer insulating spacer, the inner insulating spacer being between the substrate and the plurality of nanosheets, the inner insulating spacer contacting the source/drain region, the outer insulating spacer covering a sidewall of any one of the first gate line and the second gate line on the plurality of nanosheets, and the outer insulating spacer contacting the source/drain region, and
the plurality of stacking fault surfaces include:
at least one lower stacking fault surface linearly extending from the inner insulating spacer through the single crystalline semiconductor body toward an inside of the source/drain region, and
at least one upper stacking fault surface extending from the outer insulating spacer toward the inside of the source/drain region.

14. The integrated circuit device as claimed in claim 12, wherein the plurality of stacking fault surfaces include a first stacking fault surface and a second stacking fault surface, which extend in directions that intersect with each other.

15. The integrated circuit device as claimed in claim 12, wherein an angle between at least one of the plurality of stacking fault surfaces and a straight line in the first lateral direction is in a range of about 50° to about 60°.

16. The integrated circuit device as claimed in claim 12, wherein the plurality of stacking fault surfaces include first and second stacking fault surfaces, which extend in directions that intersect with each other, and
an angle between each of the first and second stacking fault surfaces and a straight line in the vertical direction is in a range of about 30° to about 40°.

17. The integrated circuit device as claimed in claim 12, wherein at least one of the plurality of stacking fault surfaces is parallel to a {111} crystal plane of the single crystalline semiconductor body.

18. The integrated circuit device as claimed in claim 12, wherein:
each of the plurality of nanosheets and the substrate includes a silicon film, and
a first lattice constant of silicon lattices included in at least partial regions of the plurality of nanosheets is higher than a second lattice constant of silicon lattices included in at least a partial region of the substrate.

19. An integrated circuit device, comprising:
a fin-type active region extending longitudinally in a first lateral direction on a substrate;

a nanosheet stack on a fin top surface of the fin-type active region, the nanosheet stack including a plurality of nanosheets overlapping each other in a vertical direction;

a gate line including a main gate portion and a plurality of sub-gate portions, the main gate portion extending longitudinally in a second lateral direction on the substrate and the nanosheet stack, the second lateral direction intersecting with the first lateral direction, the plurality of sub-gate portions being between two adjacent ones of the plurality of nanosheets, and the plurality of sub-gate portions being integrally connected to the main gate portion;

a plurality of inner insulating spacers respectively between the plurality of nanosheets, the plurality of inner insulating spacers covering respective sidewalls of the plurality of sub-gate portions; and a pair of source/drain regions on opposite sides of the gate line on the fin-type active region, the pair of source/drain regions being in contact with at least one inner insulating spacer adjacent thereto, from among the plurality of inner insulating spacers, wherein each of the pair of source/drain regions includes a single crystalline semiconductor body and a plurality of stacking fault surfaces linearly extending from the at least one inner insulating spacer adjacent thereto through the single crystalline semiconductor body toward insides of the source/drain regions, the plurality of stacking fault surfaces having an angle of about 50° to about 60° with respect to a straight line in the first lateral direction, and wherein a density of the plurality of stacking fault surfaces increases toward a center of the inside of the source/drain region.

20. The integrated circuit device as claimed in claim 19, wherein:

each of the pair of source/drain regions includes first and second stacking fault surfaces extending in directions that intersect with each other, and an angle between each of the first and second stacking fault surfaces and a straight line in the vertical direction is in a range of about 30° to about 40°.

* * * * *